(12) United States Patent
Wadhwa et al.

(10) Patent No.: US 8,380,138 B2
(45) Date of Patent: Feb. 19, 2013

(54) DUTY CYCLE CORRECTION CIRCUITRY

(75) Inventors: Sameer Wadhwa, San Diego, CA (US); Marzio Pedrali-Noy, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 698 days.

(21) Appl. No.: 12/582,922

(22) Filed: Oct. 21, 2009

(65) Prior Publication Data

US 2011/0090940 A1    Apr. 21, 2011

(51) Int. Cl.
*H04B 1/40* (2006.01)
(52) U.S. Cl. .......................... 455/76; 327/175
(58) Field of Classification Search .............. 455/76, 455/73; 327/172–176
See application file for complete search history.

(56) References Cited

U.S. PATENT DOCUMENTS

| | | | | |
|---|---|---|---|---|
| 6,084,452 A * | 7/2000 | Drost et al. | ................ | 327/175 |
| 6,320,438 B1 * | 11/2001 | Arcus | ................ | 327/175 |
| 6,683,494 B2 * | 1/2004 | Stanley | ................ | 330/10 |
| 7,432,752 B1 * | 10/2008 | Lee et al. | ................ | 327/175 |
| 7,705,647 B2 * | 4/2010 | Dai et al. | ................ | 327/175 |
| 2008/0164926 A1 * | 7/2008 | Choi | ................ | 327/175 |

OTHER PUBLICATIONS

Huang et al., "Low-Power 50% Duty Cycle Corrector", IEEE 2008, pp. 2362-2365, Graduate Institute of Electrical Engineering, National Taipei University, Taiwan, Dept. of Electronic Engineering, Fu-Jen Catholic University, Taiwan.
Agarwal et al., "A Duty-Cycle Correction Circuit for High-Frequency Clocks", IIEEE, 2006 Symposium on VLSI Circuits Digest of Technical Papers, IBM, Austin, Texas.
International Search Report and Written Opinion—PCT/US2010/053629—ISA/EPO—Jul. 26, 2011.

* cited by examiner

*Primary Examiner* — Nay A Maung
*Assistant Examiner* — Angelica Perez
(74) *Attorney, Agent, or Firm* — Eric Ho

(57) ABSTRACT

Closed-loop techniques for adjusting the duty cycle of a cyclical signal, e.g., a clock signal, to approach a target value. In an exemplary embodiment, a charge pump is coupled to a charge and sample module, which drives a de-skew circuit in a negative feedback loop. The charge and sample module couples the charge pump to the integration capacitor during two of four successive phases, and also couples the integration capacitor to sampling capacitors during the other two of the four successive phases. The voltages across the sampling capacitors may be used to control the de-skew circuit, which adjusts the duty cycle of a cyclical signal to be adjusted.

31 Claims, 17 Drawing Sheets

DUTY CYCLE CORRECTION CIRCUITRY

TECHNICAL FIELD

The disclosure relates to electronics, and more particularly, to techniques for adjusting the duty cycle of a periodic signal.

BACKGROUND

Phase-locked loops (PLL's) may be used to generate clock signals having predetermined frequency and/or duty cycle for applications on a system-on-chip (or "SOC"). When such clocks signals are routed from the PLL output to their destinations, e.g., via clock distribution buffers, physical interconnects, etc., there may be significant error or "skew" introduced into the duty cycle of the resulting signals. As the performance of some applications on the SOC may be sensitive to the duty cycle of the clock signals, it may be necessary to provide a duty cycle correction or adjustment circuit to correct the duty cycle of such signals prior to use in the application. Such duty cycle correction or adjustment circuits may be based on closed-loop techniques that dynamically sample and adjust the duty cycle of the clock signal.

It would be desirable to provide simple and low-power techniques for accurately adjusting periodic signals to correct for duty cycle error.

SUMMARY

An aspect of the present disclosure provides an apparatus for adjusting a duty cycle of a periodic signal to generate an adjusted signal, the adjusted signal being alternately high (HI) and low (LO) over each cycle, the apparatus comprising: a dual-phase charge pump configured to, during a first phase, supply current to a charge pump node when the adjusted signal is HI and to sink current from the charge pump node when the adjusted signal is LO, the dual-phase charge pump further configured to, during a third phase, supply current to the charge pump node when the adjusted signal is LO and to sink current from the charge pump node when the adjusted signal is HI; a charge and sample module comprising an integration capacitor having first and second terminals, the charge and sample module configured to: during a first phase, couple the first terminal of the integration capacitor to the charge pump node, the second terminal of the integration capacitor being coupled to ground; during a second phase, sample the voltage across the integration capacitor using a second sampling capacitor; during a third phase, couple the second terminal of the integration capacitor to the charge pump node, the first terminal of the integration capacitor being coupled to a supply voltage; during a fourth phase, sample the voltage across the integration capacitor using a first sampling capacitor; the apparatus further comprising: a de-skew module for adjusting the duty cycle of the periodic signal to generate an adjusted periodic signal, the duty cycle of the periodic signal adjusted according to the voltage across the first sampling capacitor.

Another aspect of the present disclosure provides a method for adjusting a duty cycle of a periodic signal to generate an adjusted signal, the adjusted signal being alternately high (HI) and low (LO) over each cycle, the method comprising: during a first phase: supplying a first current to a charge pump node when the adjusted signal is HI and sinking a second current from the charge pump node when the adjusted signal is LO; and coupling a first terminal of an integration capacitor to the charge pump node, a second terminal of the integration capacitor being coupled to ground; during a second phase: sampling the voltage across the integration capacitor using a second sampling capacitor; during a third phase: supplying the first current to the charge pump node when the adjusted signal is LO and sinking the second current from the charge pump node when the adjusted signal is HI; and coupling the second terminal of the integration capacitor to the charge pump node, the first terminal of the integration capacitor being coupled to a supply voltage; during a fourth phase: sampling the voltage across the integration capacitor using a first sampling capacitor; and adjusting the duty cycle of the periodic signal according to the voltage across the first sampling capacitor to generate an adjusted periodic signal.

Yet another aspect of the present disclosure provides an apparatus for adjusting a duty cycle of a periodic signal to generate an adjusted signal, the apparatus comprising: dual-phase means for supplying current to and sinking current from a charge pump node; means for charging and discharging a charge storage element coupled to the charge pump node in response to a plurality of phases; and means for adjusting the duty cycle of the periodic signal to generate the adjusted signal in response to at least one voltage of the capacitor.

Yet another aspect of the present disclosure provides a computer program product storing code for causing a computer to generate an output signal having a predetermined duty cycle, the code comprising: code for causing a computer to, during a first phase: supply a first current to a charge pump node when the adjusted signal is HI and sink a second current from the charge pump node when the adjusted signal is LO; and couple a first terminal of an integration capacitor to the charge pump node, a second terminal of the integration capacitor being coupled to ground; code for causing a computer to, during a second phase: sample the voltage across the integration capacitor using a second sampling capacitor; code for causing a computer to, during a third phase: supply the first current to the charge pump node when the adjusted signal is LO and sink the second current from the charge pump node when the adjusted signal is HI; and couple the second terminal of the integration capacitor to the charge pump node, the first terminal of the integration capacitor being coupled to a supply voltage; code for causing a computer to, during a fourth phase: sample the voltage across the integration capacitor using a first sampling capacitor; and code for causing a computer to, adjust the duty cycle of the periodic signal according to the voltage across the first sampling capacitor to generate an adjusted periodic signal.

Yet another aspect of the present disclosure provides a device for wireless communications, the device comprising at least one digital-to-analog converter (DAC) for converting a digital TX signal to an analog TX signal, at least one baseband TX amplifier for amplifying the analog TX signal, a TX LO signal generator, an upconverter coupled to the TX LO signal generator and the at least one baseband TX amplifier, a TX filter coupled to the output of the upconverter, a power amplifier (PA) coupled to the TX filter, an RX filter, a low-noise amplifier (LNA) coupled to the RX filter, an RX LO signal generator, a downconverter coupled to the RX LO signal generator and the RX filter, at least one low-pass filter coupled to the output of the downconverter, at least one analog-to-digital converter (ADC) for converting the output of the low-pass filter into a digital signal, a clock signal generator adjusting a duty cycle of a periodic signal to generate an adjusted signal, the adjusted signal being alternately high (HI) and low (LO) over each cycle, at least one of the DAC and the ADC being driven by an adjusted signal generated by the clock signal generator, the clock signal generator comprising: a dual-phase charge pump configured to, during a first phase, supply current to a charge pump node when the adjusted signal is HI and to sink current from the charge pump node when the adjusted signal is LO, the dual-phase charge pump further configured to, during a third phase, supply current to the charge pump node when the adjusted signal is LO and to sink current from the charge pump node when the adjusted signal is HI; a charge and sample module comprising an integration capacitor having first and second terminals, the charge and sample module configured to: during a first phase, couple the first terminal of the integration capacitor to the charge pump node, the second terminal of the integration capacitor being coupled to ground; during a second phase, sample the voltage across the integration capacitor using a second sampling capacitor; during a third phase, couple the second terminal of the integration capacitor to the charge pump node, the first terminal of the integration capacitor being coupled to a supply voltage; during a fourth phase, sample the voltage across the integration capacitor using a first sampling capacitor; the apparatus further comprising: a de-skew module for adjusting the duty cycle of the periodic signal to generate an adjusted periodic signal, the duty cycle of the periodic signal adjusted according to the voltage across the first sampling capacitor.

Yet another aspect of the present disclosure provides an apparatus comprising: a dual-phase charge pump comprising a first current source and a second current source, the first and second current source coupled to a charge pump node by first and second charge pump switches, respectively; a charge and sample module comprising: an integration capacitor having first and second terminals; first and second charge switches coupling the first and second terminals, respectively, of the integration capacitor to the charge pump node; third and fourth charge switches coupling the first and second terminals, respectively, of the integration capacitor to reference voltages; first and second sample switches coupling the first and second terminals, respectively, or the integration capacitor to first and second sampling capacitors, respectively; and a de-skew module for adjusting the duty cycle of the periodic signal to generate an adjusted periodic signal, the duty cycle of the periodic signal adjusted according to the voltage across the first sampling capacitor.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
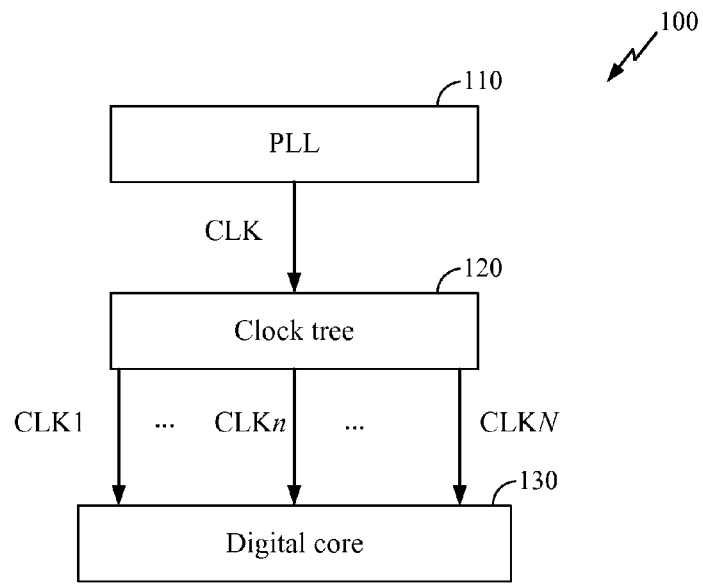
FIG. 1 illustrates a prior art system employing a phase-lock loop (PLL) to generate one or more clock signals for a digital core.

FIG. 1 illustrates a prior art system 100 employing a phase-lock loop (PLL) to generate one or more clock signals for a digital core 130. In FIG. 1, a PLL 110 generates a clock signal CLK having a predetermined frequency and/or duty cycle. CLK is provided to a clock tree 120 for generating and distributing multiple instances CLK1 through CLKN of CLK for distribution to a digital core 130. The digital core 130 may accept CLK1 through CLKN as, e.g., reference signals for multiple applications implemented in the digital core 130. It will be appreciated that certain such applications may require the clock signals to have a certain duty cycle, e.g., 50%.

Figure 1A:
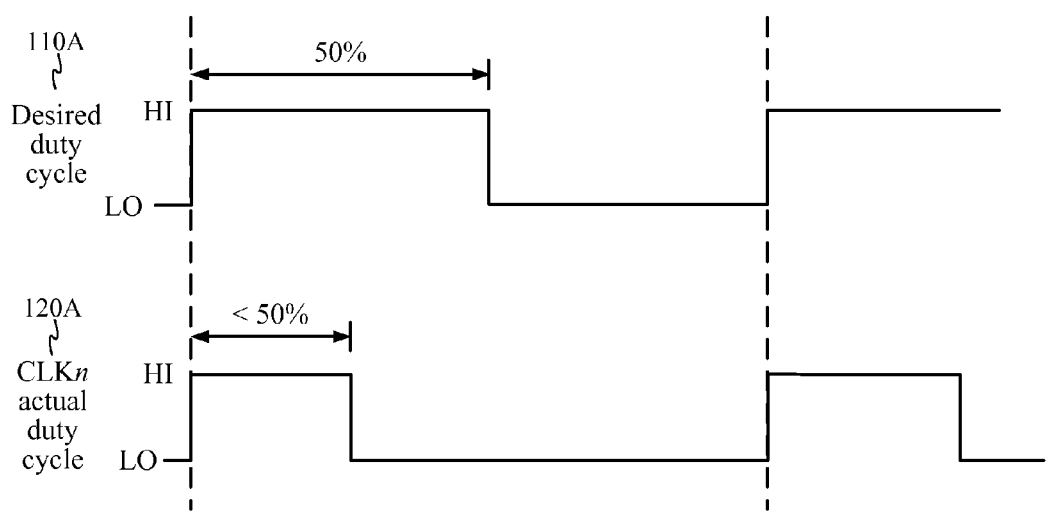
FIG. 1A illustrates exemplary signal waveforms that may be present in the system of FIG. 1.

FIG. 1A illustrates exemplary signal waveforms relevant to the system 100. In FIG. 1A, a periodic signal 110A alternates between a logical high level (or "HI") and a logical low level (or "LO") with a duty cycle of 50%. Note that while the term "duty cycle" as used herein may refer to the portion of a signal cycle during which the signal is HI compared to the duration of the entire signal cycle, and such convention is adopted herein in this disclosure unless otherwise noted, one of ordinary skill in the art will appreciate that the principles of the present disclosure may readily be applied to systems adopting other conventions. For example, alternative exemplary embodiments may reference "duty cycle" to the portion of a signal cycle during which a signal is LO. Alternatively, the definition of "duty cycle" may be based on an arbitrarily specified portion of the cycle of any periodic signal. It will be appreciated that while certain signals having desired duty cycles of 50% are referred to herein for illustrative purposes, the discussion herein readily applies to desired duty cycles other than 50%.

In FIG. 1A, an actual signal 120A having a duty cycle less than 50% is shown. The signal 120A may correspond, e.g., to an actual signal CLKn, e.g., as generated by the clock tree 120 in FIG. 1. The discrepancy between the desired duty cycle of signal 110A and the duty cycle of signal 120A represents a duty cycle error. Such duty cycle error may be due to, e.g., error introduced by the PLL 110 and/or clock tree 120, as well as parasitic circuit elements present in the physical traces routing the signals across an integrated circuit (IC). As some applications in the digital core 130 may specify a minimum tolerance on the allowable duty cycle error of clock signals, it would be desirable to provide techniques to reduce the duty cycle error of such signals.

Figure 2:
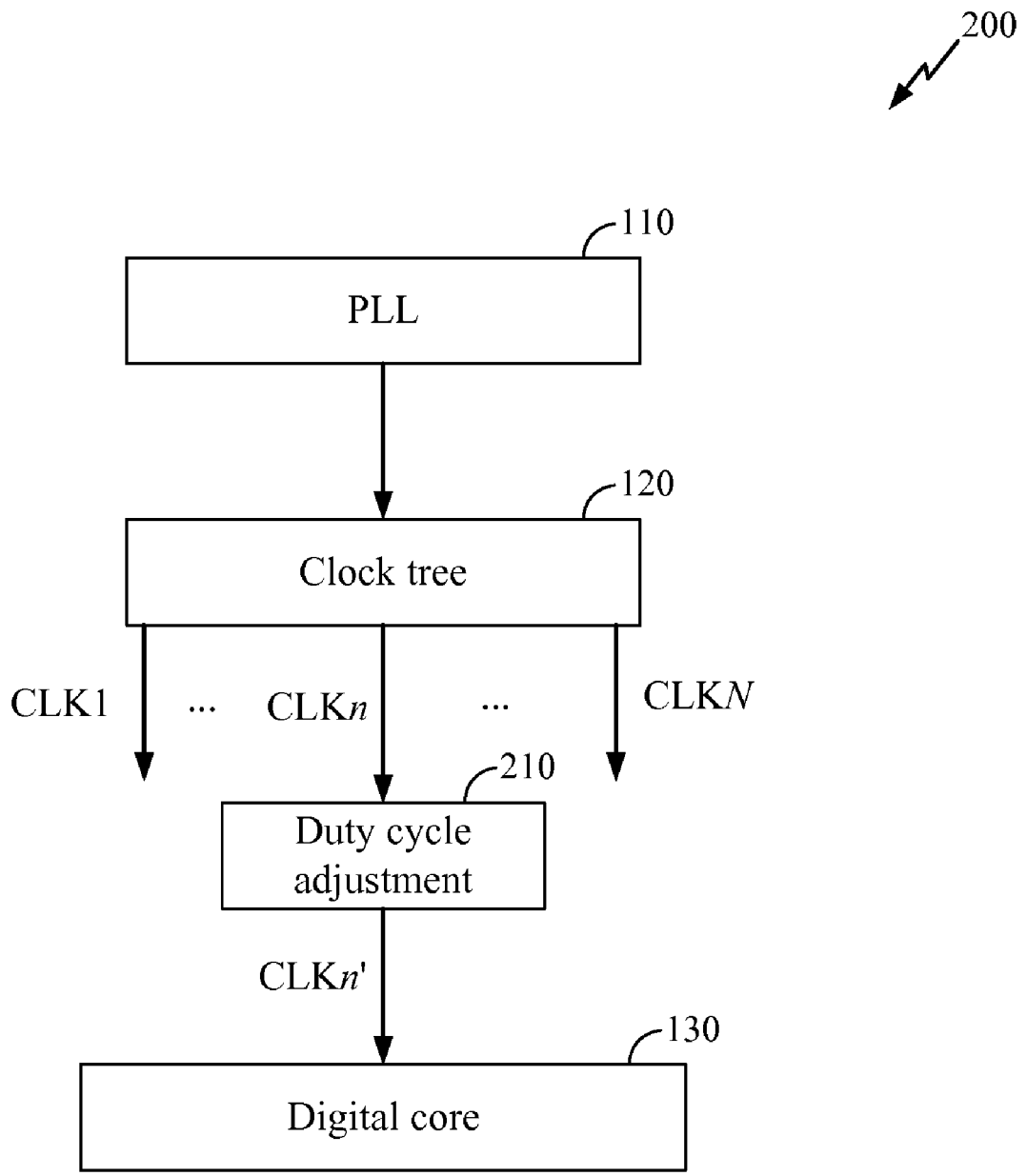
FIG. 2 illustrates a system employing a duty cycle adjustment module.

FIG. 2 illustrates a system 200 employing a duty cycle adjustment module 210. Note similarly labeled blocks in FIGS. 1 and 2 may have similar functionality, unless otherwise noted. In FIG. 2, a duty cycle adjustment module 210 is coupled to a particular instance CLKn of CLK at the output of the clock tree 120, and generates an adjusted clock signal CLKn' prior to coupling to the digital core 130.

Figure 2A:
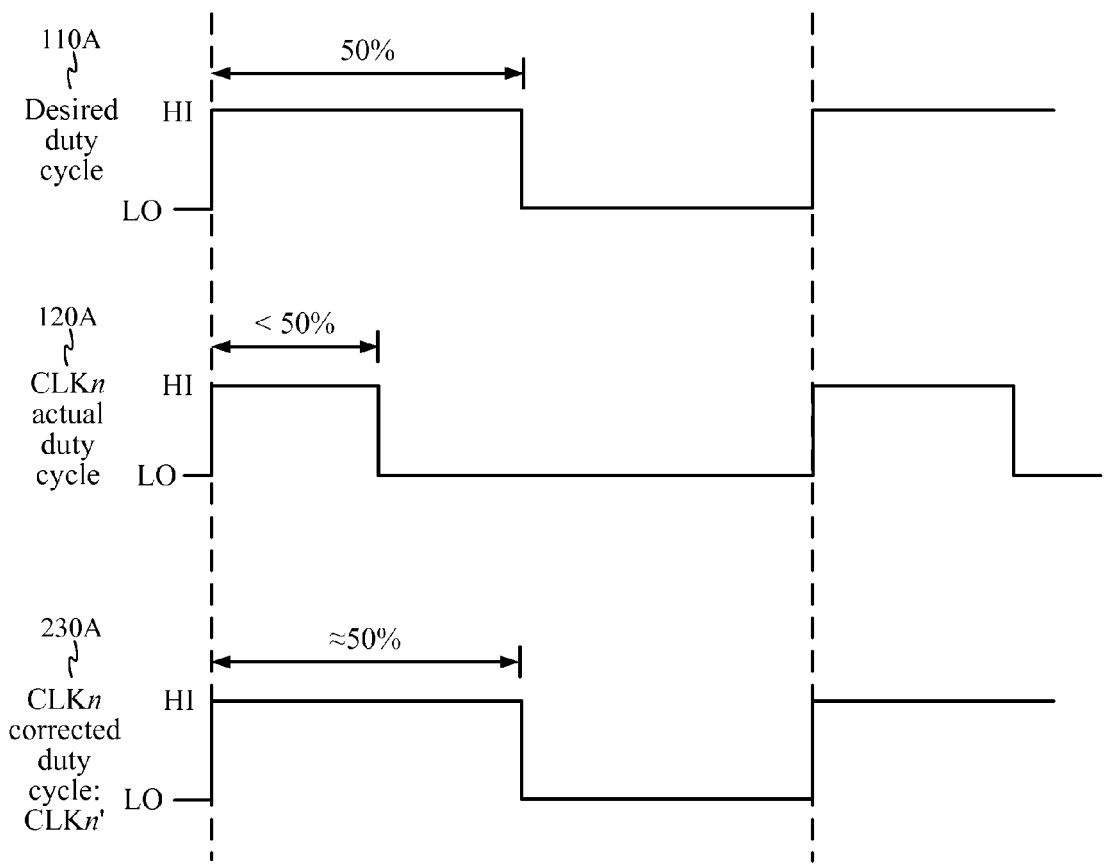
FIG. 2A illustrates exemplary signal waveforms that may be present in the system of FIG. 2.

As shown in FIG. 2A, the adjusted clock signal CLKn' 230A generated by the duty cycle adjustment module 210 may have less duty cycle error than the signal 120A.

Note the duty cycle adjustment module 210 may be provided at a location proximal to the digital core 130, e.g., to minimize the routing distance from the output of the duty cycle adjustment module 210 to the digital core 130.

While a duty cycle adjustment module 210 coupled to a single clock signal CLKn has been shown in FIG. 2 for ease of illustration, it will be appreciated that multiple duty cycle adjustment modules may be provided, e.g., for each of multiple instances of CLKn that may require duty cycle adjustment. It will be appreciated that such multiple duty cycle adjustments may each adjust the duty cycle of a corresponding clock signal to a different value to suit the requirements of a particular application.

Figure 3:
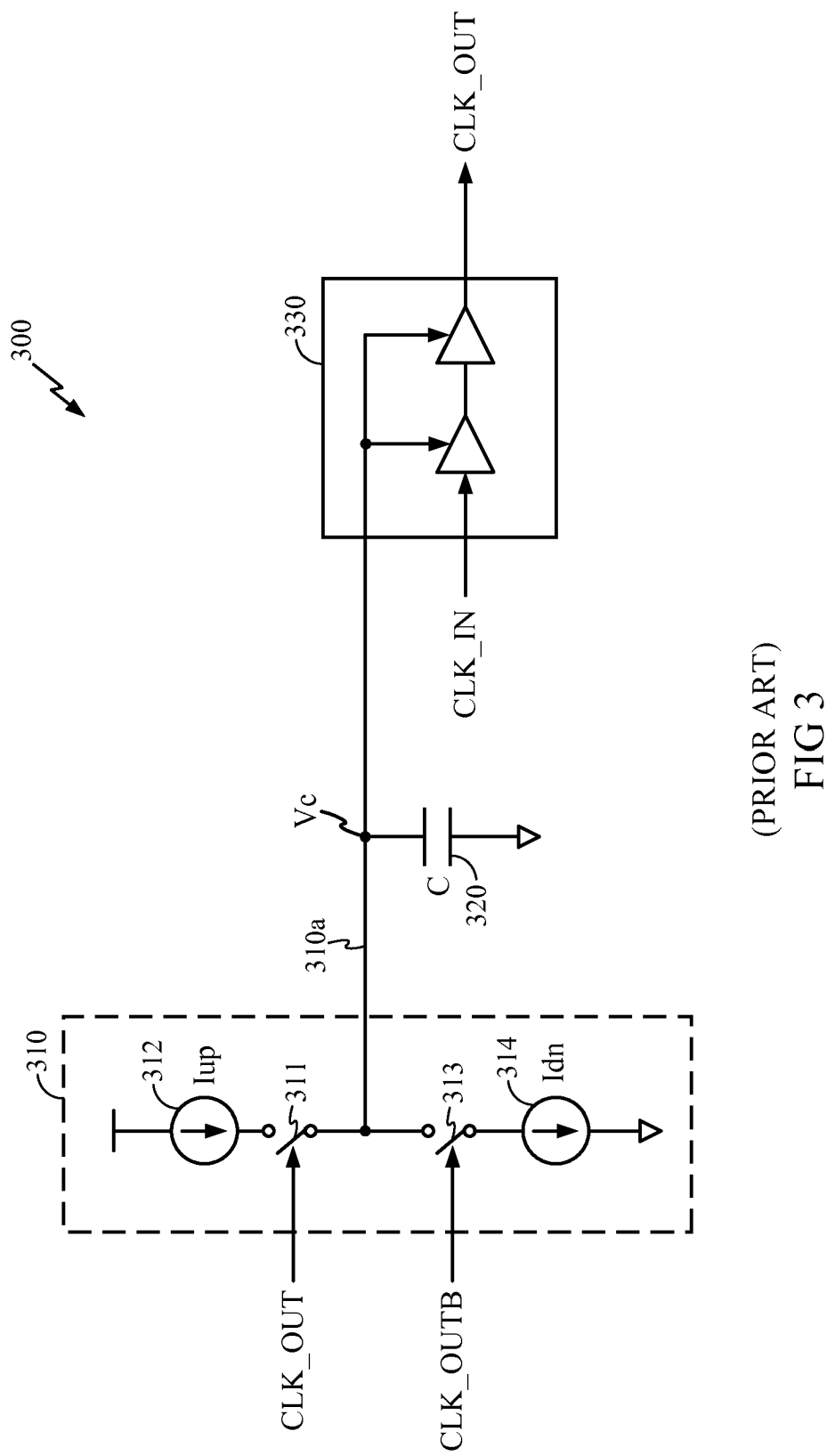
FIG. 3 illustrates a prior art implementation of a closed-loop duty cycle adjustment module.

FIG. 3 illustrates a prior art implementation 300 of a closed-loop duty cycle adjustment module 210. Further details of the duty cycle adjustment module 300 may be found in, e.g., Huang, et al., "Low-Power 50% Duty Cycle Corrector," IEEE International Symposium on Circuits and Systems (2008).

In FIG. 3, the duty cycle adjustment module 300 includes a charge pump 310, a storage capacitor C 320, and a de-skew module 330. The de-skew module 330 generates an adjusted output clock signal CLK_OUT from an input clock signal CLK_IN. For example, at a system level, CLK_IN may correspond, e.g., to an instance CLKn of the clock signal CLK generated by the clock tree 120 in FIG. 2, and CLK_OUT may correspond, e.g., to an adjusted clock signal CLKn'.

The charge pump 310 of the duty cycle adjustment module 300 includes a first current source 312 and a second current source 314. The first current source 312 supplies a current Iup to a charge pump node 310a via a switch 311 controlled by the signal CLK_OUT. The second current source 314 sinks a current Idn from the charge pump node 310a via a switch 313 controlled by a signal CLK_OUTB, i.e., the logical inverse of CLK_OUT. For example, a switch may be closed when a corresponding control signal is HI, and open when the corresponding control signal is LO.

The charge pump node 310a is coupled to a storage capacitor C 320. It will be appreciated from the above description that the charge pump 310 may alternately charge the capacitor C 320 via the first current source 312 when CLK_OUT is HI (and CLK_OUTB is LO), and discharge the capacitor C 320 via the second current source 314 when CLK_OUT is LO (and CLK_OUTB is HI). The voltage Vc across the capacitor C 320 is coupled as a control signal to the de-skew module 330.

The de-skew module 330 adjusts the duty cycle of an input signal CLK_IN in response to Vc to generate the output signal CLK_OUT. For example, an increase in Vc may decrease the duty cycle of CLK_OUT relative to CLK_IN, while a decrease in Vc may increase the duty cycle of CLK_OUT relative to CLK_IN. The output signal CLK_OUT of the de-skew module is coupled back to the charge pump 310 in a negative feedback manner to control switches 311 and 313 of the charge pump 310.

Figure 3A:
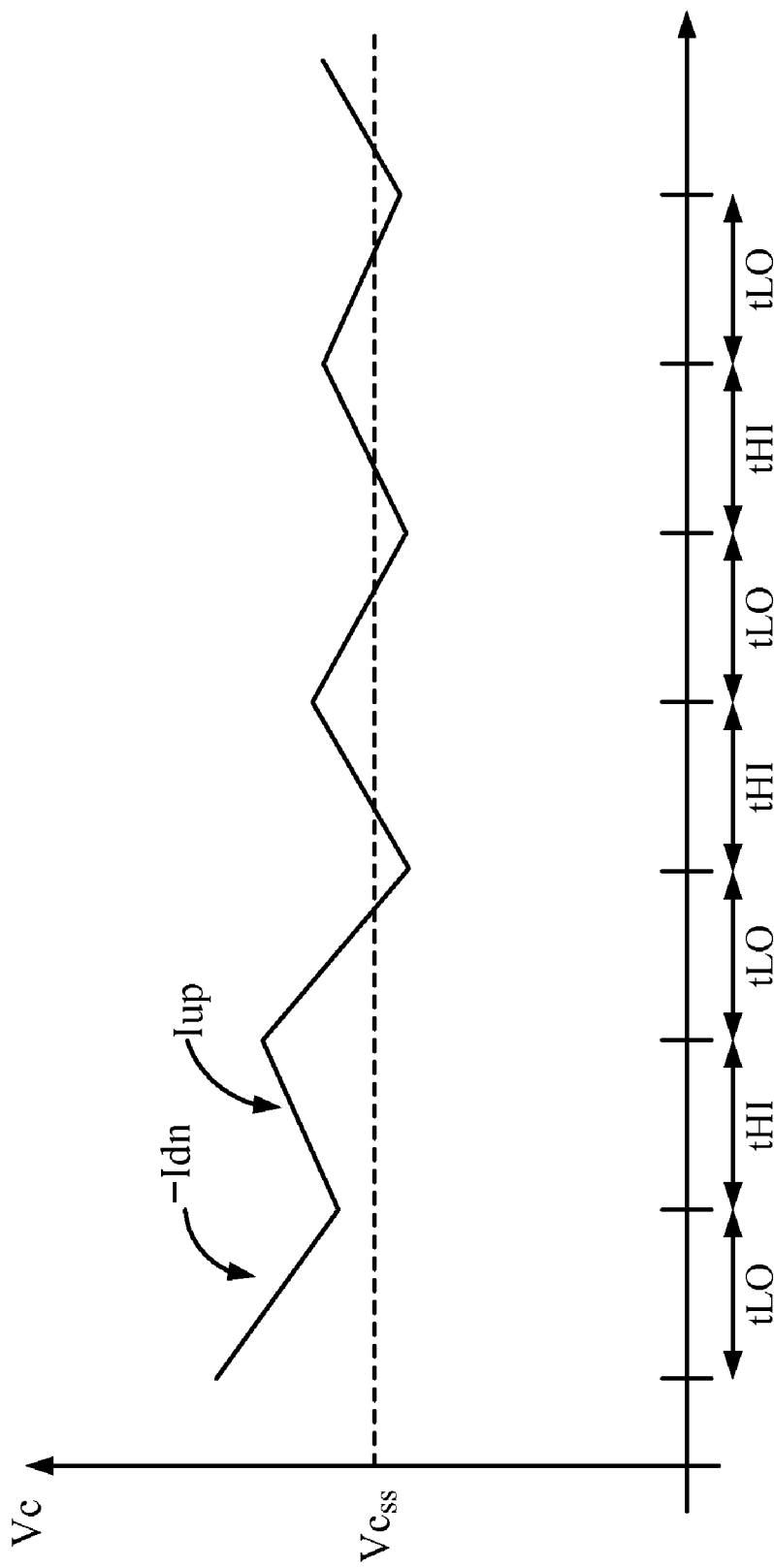
FIG. 3A illustrates the control voltage Vc over time according to the operation of the duty cycle adjustment module.

FIG. 3A illustrates the control voltage Vc over time according to the operation of the duty cycle adjustment module 300. In FIG. 3A, the control voltage Vc is shown to alternately decrease and increase over time, with the slope generally corresponding to −Idn over a time period tLO wherein CLK_OUT is LO, and the slope generally corresponding to Iup over a time period tHI wherein CLK_OUT is HI.

In light of the above description, the net charge dQ injected into the storage capacitor C 320 over each cycle of CLK_OUT may be expressed as follows:

$$dQ = Idn \cdot tLO - Iup \cdot tHI. \quad \text{(Eq. 1)}$$

It will be appreciated that through the negative feedback (closed) loop formed by the charge pump 310, storage capacitor C 320, and de-skew module 330, the control voltage Vc eventually settles around a steady-state voltage $Vc_{ss}$ as shown in FIG. 3A, wherein the net charge dQ injected into the capacitor over each cycle is zero, i.e.:

$$dQ = 0; \quad \text{(Eq. 2a)}$$
$$= Idn \cdot tLO - Iup \cdot tHI; \text{ and} \quad \text{(Eq. 2b)}$$
$$Idn \cdot tLO = Iup \cdot tHI. \quad \text{(Eq. 2c)}$$

In light of the above description, it will be appreciated that, in the prior art module 300, by appropriately setting the values of the currents Idn and Iup, an arbitrary desired duty cycle tHI/(tHI+tLO) may be achieved for the output signal CLK_OUT during steady state. For example, setting Idn equal to Iup causes tLO to equal tHI in steady state, resulting in a desired 50% duty cycle for CLK_OUT.

It will be further appreciated that the accuracy of the duty cycle of CLK_OUT generated by the prior art duty cycle adjustment module 300 may be limited by mismatch between the currents Idn and Iup in the charge pump 310. For example, it can be seen from Equation 1 that for a desired 50% duty cycle, if Idn≠Iup, then tLO≠tHI in steady state. It would be desirable to provide a duty cycle adjustment module whose accuracy is not limited in such a manner.

Figure 4:
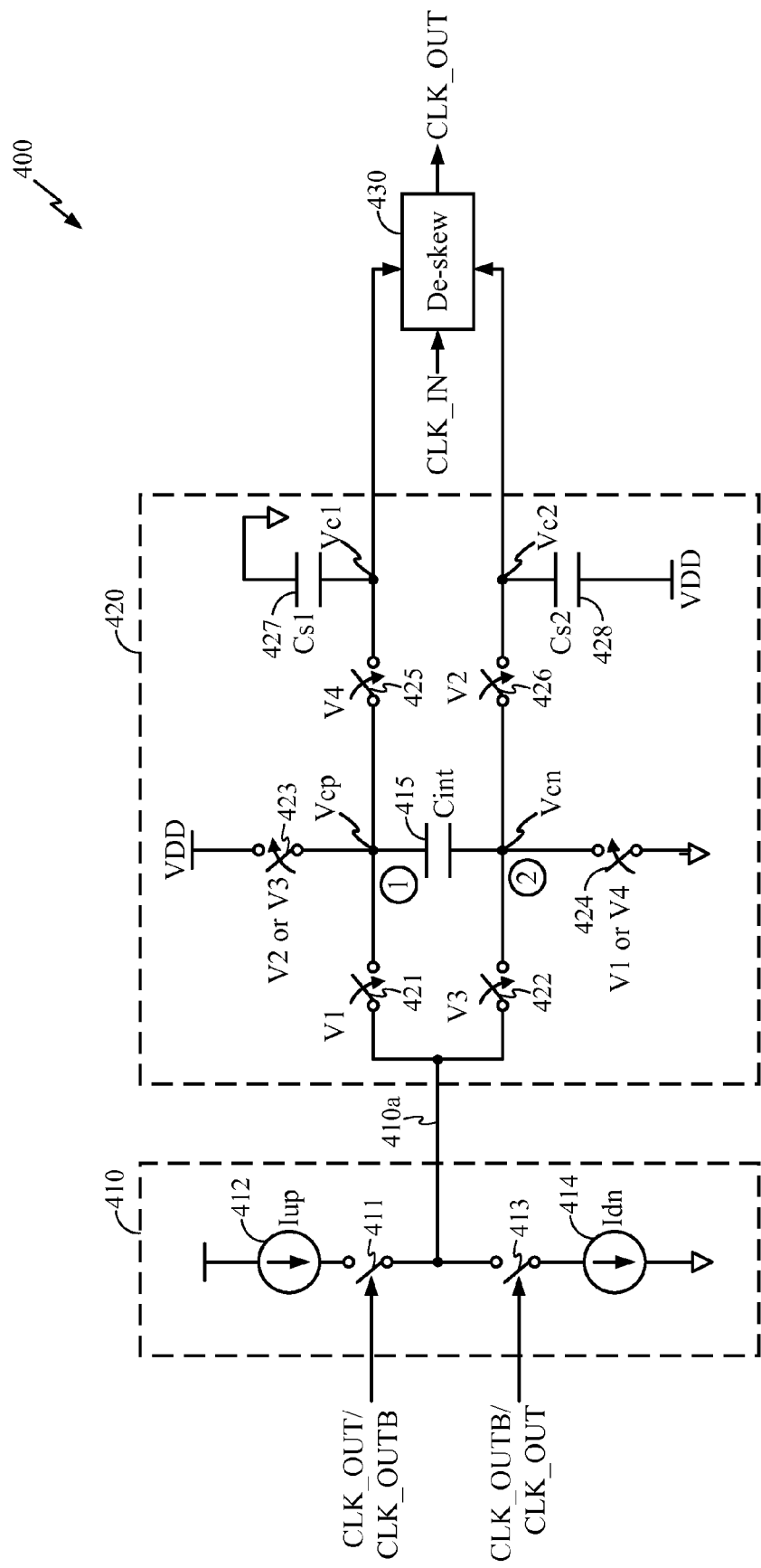
FIG. 4 illustrates an exemplary embodiment of a duty cycle adjustment module according to the present disclosure.

FIG. 4 illustrates an exemplary embodiment of a duty cycle adjustment module 400 according to the present disclosure. In FIG. 4, the duty cycle adjustment module 400 includes a dual-phase charge pump 410, a charge and sample module 420, and a de-skew module 430.

The charge and sample module 420 includes a charge storage element such as an integration capacitor Cint 415 configured to be charged by the dual-phase charge pump 410 via a plurality of switches in the module 420. In particular, switches 421 and 422 selectively couple the first and second terminals (labeled in FIG. 4 as the circled numerals 1 and 2, respectively) of Cint 415 to the charge pump node 410a, while switches 423 and 424 further selectively couple the first and second terminals of Cint 415 to VDD and ground, respectively. Voltages Vcp and Vcn at the first and second terminals of Cint 415 are further configured to be sampled by first and second sampling capacitors Cs1 427 and Cs2 428 via switches 425 and 426, respectively. The sampling capacitors Cs1 427 and Cs2 428 provide the voltages Vc1 and Vc2, respectively, to the de-skew module 430, which adjusts the duty cycle of an input signal CLK_IN according to Vc1 and Vc2 to generate CLK_OUT.

Note one of ordinary skill in the art may readily derive implementations of the de-skew module 430 in light of the present disclosure. For example, a de-skew module 430 may incorporate a chain of current-starved inverters (not shown), wherein the amount of current supplied to the inverters is controlled by the control voltages Vc1 and Vc2.

The configuration of the switches in the charge and sample module 420 are determined according to a set of control signals V1, V2, V3, and V4, each of which is individually asserted according to a four-phase scheme as further described hereinbelow with reference to FIGS. 5A through 5D. In particular, during the first phase (I), V1 is HI, while V2, V3, and V4 are LO. During the second phase (II), V2 is HI, while V1, V3, and V4 are LO. During the third phase (III), V3 is HI, while V1, V2, and V4 are LO. During the fourth phase (IV), V4 is HI, while V1, V2, and V3 are LO. In an exemplary embodiment, each of the phases may span one cycle of CLK_OUT, during which CLK_OUT is HI for a time tHI and then CLK_OUTB is HI for a time tLO. A complete set of four phases is herein denoted one "control loop."

Note in alternative exemplary embodiments (not shown), each of the phases may span more than one cycle of CLK_OUT, e.g., two or three cycles of CLK_OUT. Such alternative exemplary embodiments may advantageously reduce power consumption at high frequency, and/or help simplify programmable duty cycle design, and are contemplated to be within the scope of the present disclosure.

Figure 5A:
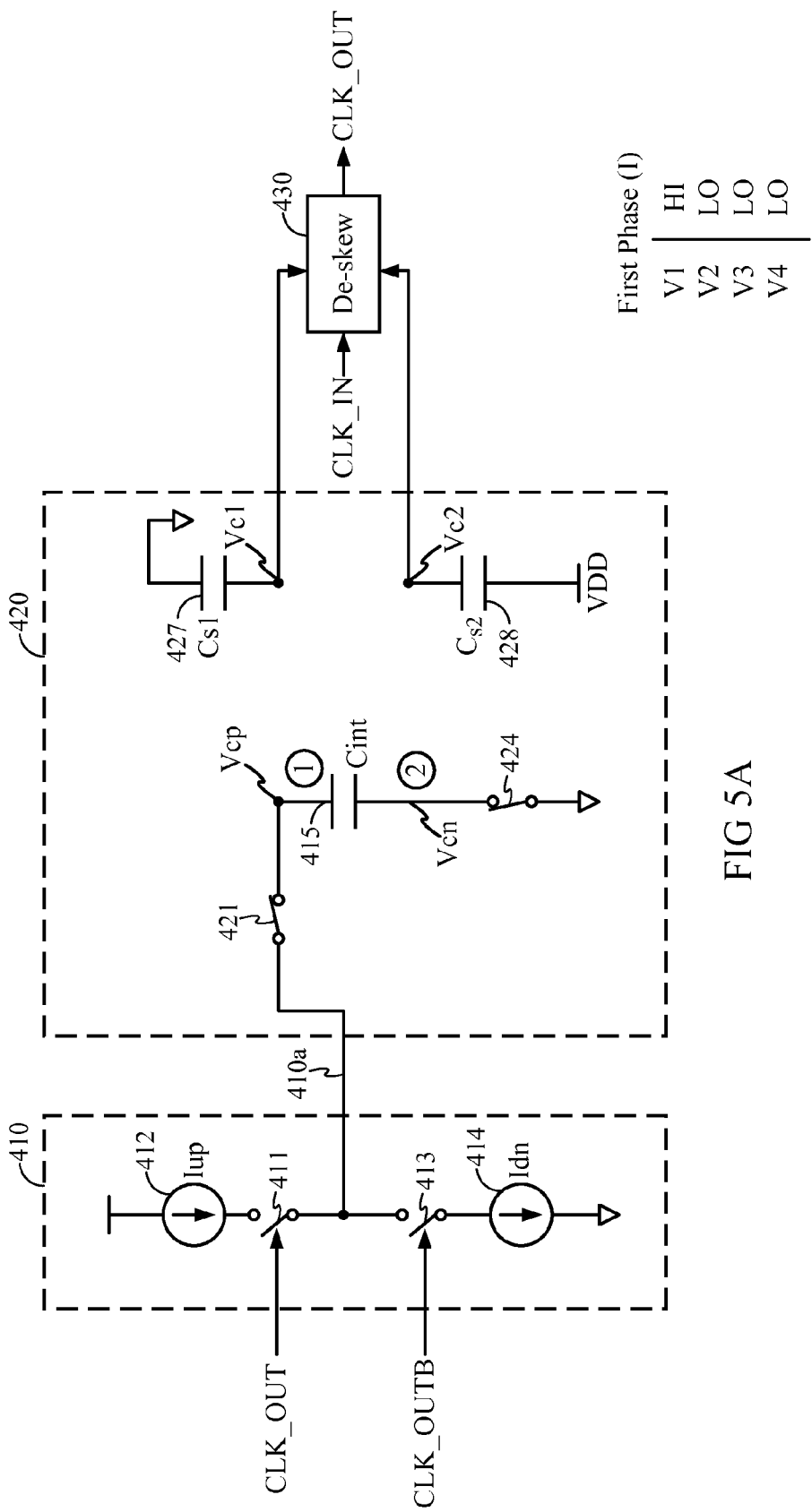
FIGS. 5A-5D illustrates the configuration of circuitry in the duty cycle adjustment module during the first, second, third, and fourth phases.
Figure 6:
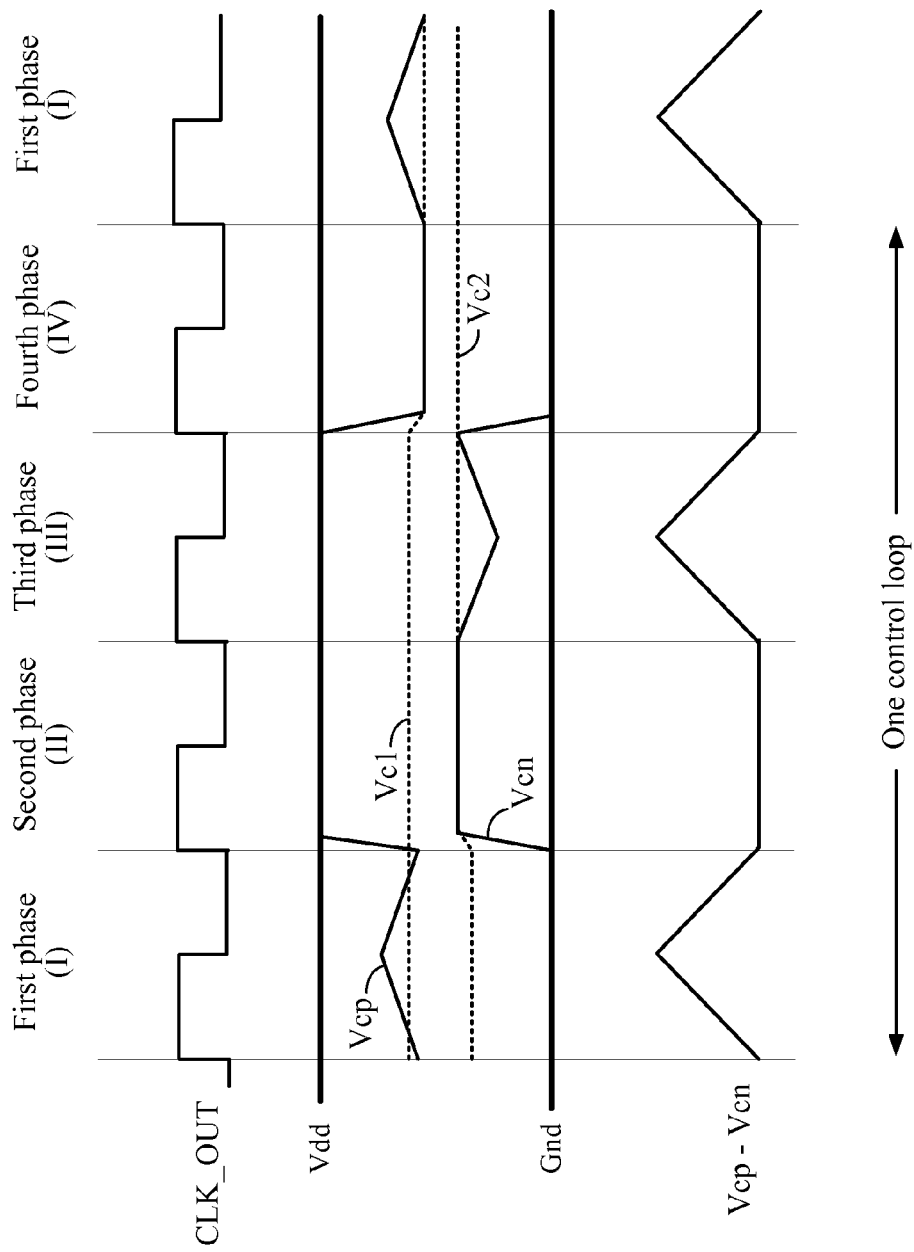
FIG. 6 illustrates exemplary signal waveforms that may be present during the first, second, third, and fourth phases.

FIG. 5A illustrates the configuration of circuitry in the duty cycle adjustment module 400 during the first phase. During the first phase, switches 421 and 424 are closed, while the other switches of the charge and sample module 420 are open. Consequently, as illustrated in FIG. 6, the voltage Vcp of the integration capacitor Cint 415 rises and falls due to the first terminal of Cint 415 being alternately charged and discharged by the currents Iup and Idn, respectively. Note that during the first phase, the second terminal of the integration capacitor Cint 415 is coupled to ground. Furthermore, the integration capacitor Cint 415 is de-coupled from the de-skew module 430 by the opening of switches 425 and 426 (not shown in FIG. 5A). The control voltages Vc1 and Vc2 of the de-skew module 430 are supplied by sampling capacitors Cs1 427 and Cs2 428, which may, e.g., store charge as sampled from the Cint 415 during a previous phase.

It will be appreciated that the charge dQ1 injected into the first terminal of the integration capacitor Cint 415 during the first phase may be expressed as follows:

$$dQ1 = Iup*tHI - Idn*tLO. \quad \text{(Eq. 3)}$$

Figure 5B:
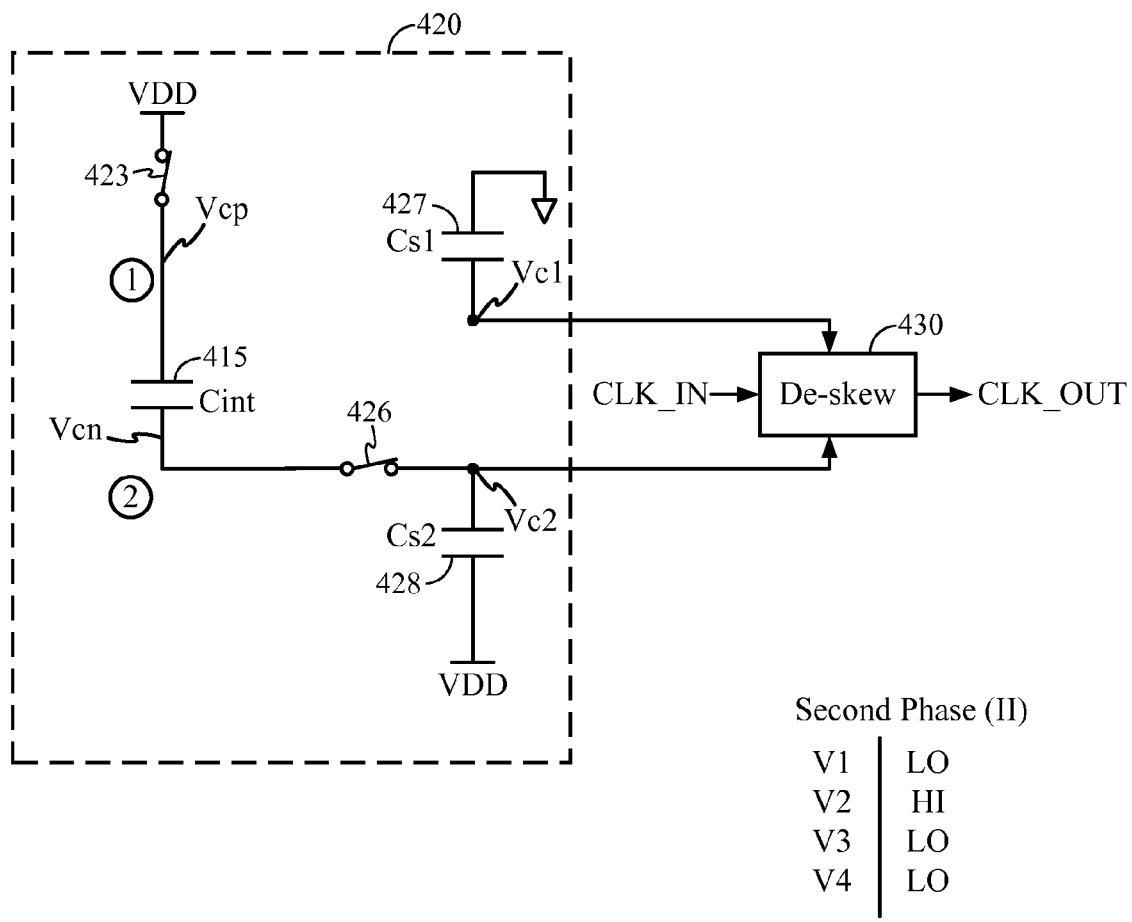

FIG. 5B illustrates the configuration of circuitry in the duty cycle adjustment module 400 during the second phase. In FIG. 5B, switches 423 and 426 are closed, while the other switches of the charge and sample module 420 are open. Consequently, as illustrated in FIG. 6, the voltage Vc2 of Cs2 428 approaches the voltage Vcn of Cint 415 over time, as the terminals of the integration capacitor Cint 415 are effectively shorted to those of the sampling capacitor Cs2 428, and the voltage across Cint 415 is sampled by Cs2 via charge transfer. Note the integration capacitor Cint 415 is de-coupled from the dual-phase charge pump 410 during the second phase.

In an exemplary embodiment, to facilitate the charge transfer, the capacitance of the sampling capacitor Cs2 428 may be made much smaller than the capacitance of the integration capacitor Cint 415. For example, in an exemplary embodiment, Cs2 428 may have a capacitance of 0.5 pF, while Cint 415 may have a capacitance of 5 pF.

Figure 5C:
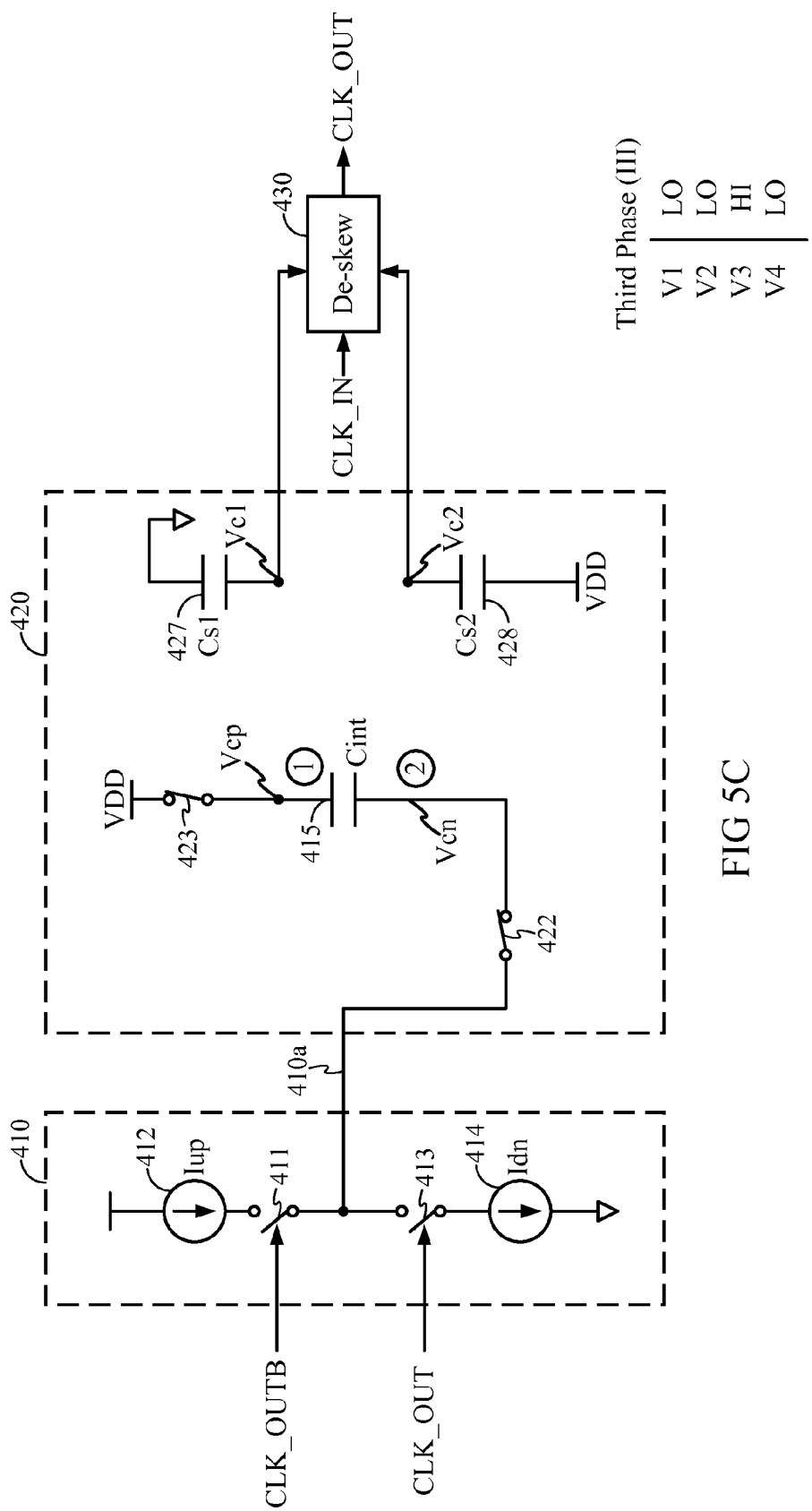

FIG. 5C illustrates the configuration of circuitry in the duty cycle adjustment module 400 during the third phase. In FIG. 5C, switches 422 and 423 are closed, while the other switches of the charge and sample module 420 are open. Consequently, as illustrated in FIG. 6, the voltage Vcn of the integration capacitor Cint 415 falls and rises due to the second terminal of Cint 415 being alternately discharged and charged by the currents Idn and Iup, respectively. In particular, the current Idn is coupled to the charge pump node 410a during the time tHI, while the current Iup is coupled to the charge pump node 410a during the time tLO. Note during the third phase, the first terminal of the integration capacitor Cint 415 is coupled to VDD. Furthermore, the integration capacitor Cint 415 is de-coupled from the de-skew module 430 by the opening of switches 425 and 426 (not shown in FIG. 5C).

It will be appreciated that the charge dQ2 injected into the second terminal of the integration capacitor Cint 415 during the third phase may be expressed as follows:

$$dQ2 = -Idn*tHI + Iup*tLO. \quad \text{(Eq. 4)}$$

Since dQ2 is injected onto the opposite capacitor terminal from dQ1, charge-subtraction occurs on the sampling capacitor, as will be later explained with reference to Equation 5 hereinbelow.

Figure 5D:
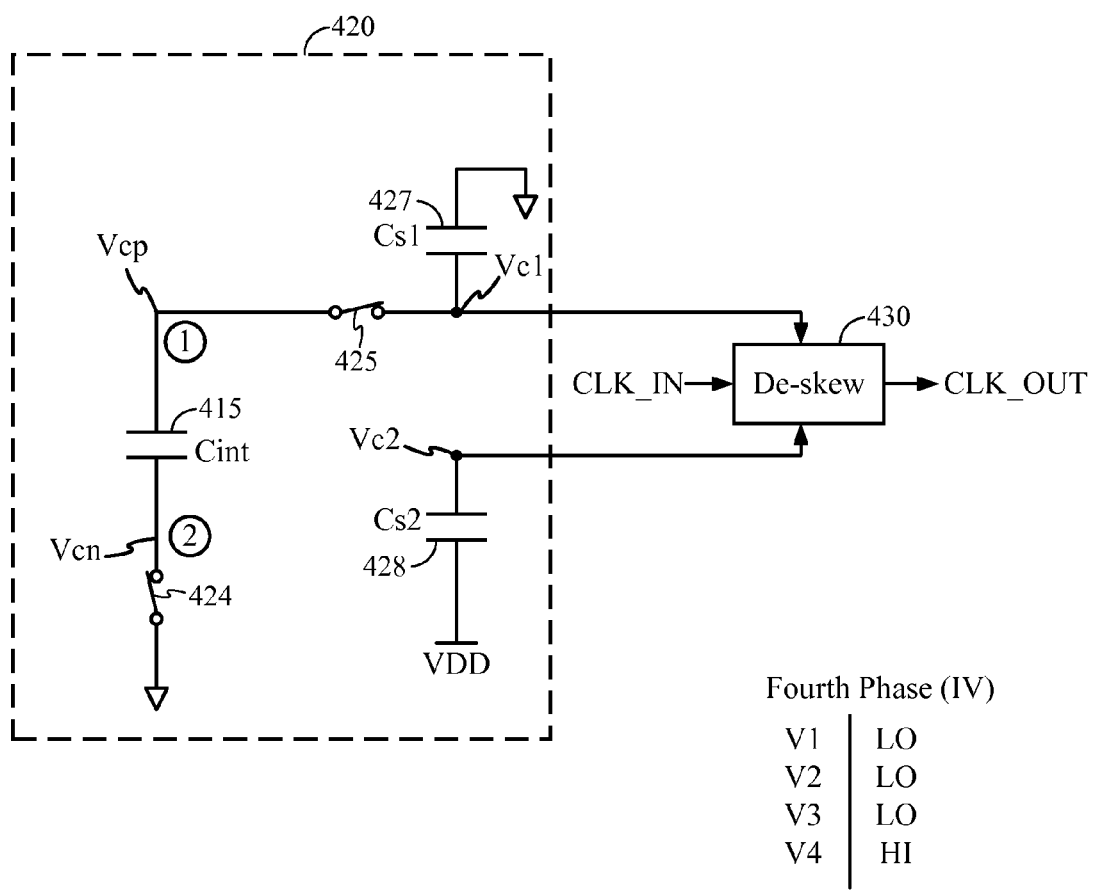

FIG. 5D illustrates the configuration of the circuitry in the duty cycle adjustment module 400 during the fourth phase. In FIG. 5D, switches 424 and 425 are closed, while the other switches of the charge and sample module 420 are open. Consequently, as illustrated in FIG. 6, the voltage Vc1 of Cs1 427 approaches the voltage Vcp of Cint 415 over time, as the terminals of the integration capacitor Cint 415 are effectively shorted to those of the sampling capacitor Cs1 427, and the voltage across Cint 415 is sampled by Cs1 via charge transfer. Note the integration capacitor Cint 415 is de-coupled from the dual-phase charge pump 410 during the fourth phase.

In an exemplary embodiment, to facilitate the charge transfer, the capacitance of the sampling capacitor Cs1 427 may be made much smaller than the capacitance of the integration capacitor Cint 415. For example, in an exemplary embodiment, Cs1 427 and Cs2 428 may each have a capacitance of 0.5 pF, while Cint 415 may have a capacitance of 5 pF.

In light of the above description, the net charge dQ1−dQ2 injected into the integration capacitor Cint 415 (i.e., the difference between the charges injected into the first and second terminals) over the first and third phases may be expressed as follows:

$$dQ1 - dQ2 = (tHI - tLO)*(Iup + Idn). \quad \text{(Eq. 5)}$$

It will be appreciated that through the negative feedback loop formed by the dual-phase charge pump 410, charge and sample module 420, and de-skew module 430, the control voltages Vc1 and Vc2 eventually settle around steady-state voltages wherein the net charge dQ1−dQ2 is zero, i.e., dQ1−dQ2=0=(tHI−tLO)*(Iup+Idn), or tHI=tLO. This corresponds to a desired 50% duty cycle. Note that this is achieved regardless of any mismatch between Iup and Idn.

One of ordinary skill in the art will appreciate that in alternative exemplary embodiments, certain of the DC voltages may be modified from those explicitly shown in the accompanying figures. For example, the integration capacitor Cint 415 may be connected to an alternative DC voltage rather than to ground via switch 424. Similarly, the integration capacitor Cint 415 need not be connected via switch 423 to the same voltage used to supply any other modules of the circuit. Such alternative exemplary embodiments are contemplated to be within the scope of the present disclosure.

One of ordinary skill in the art will further appreciate that alternative exemplary embodiments of the duty cycle adjustment module 400 may incorporate, e.g., configurations of switching mechanisms or control mechanisms other than those explicitly shown. For example, the durations of the first and third phases need not equal the durations of the second and fourth phases. Furthermore, the phases need not follow each other without interruption, e.g., there may be further intermediate phases provided between the phases explicitly described. Such alternative exemplary embodiments are contemplated to be within the scope of the present disclosure.

Figure 7:
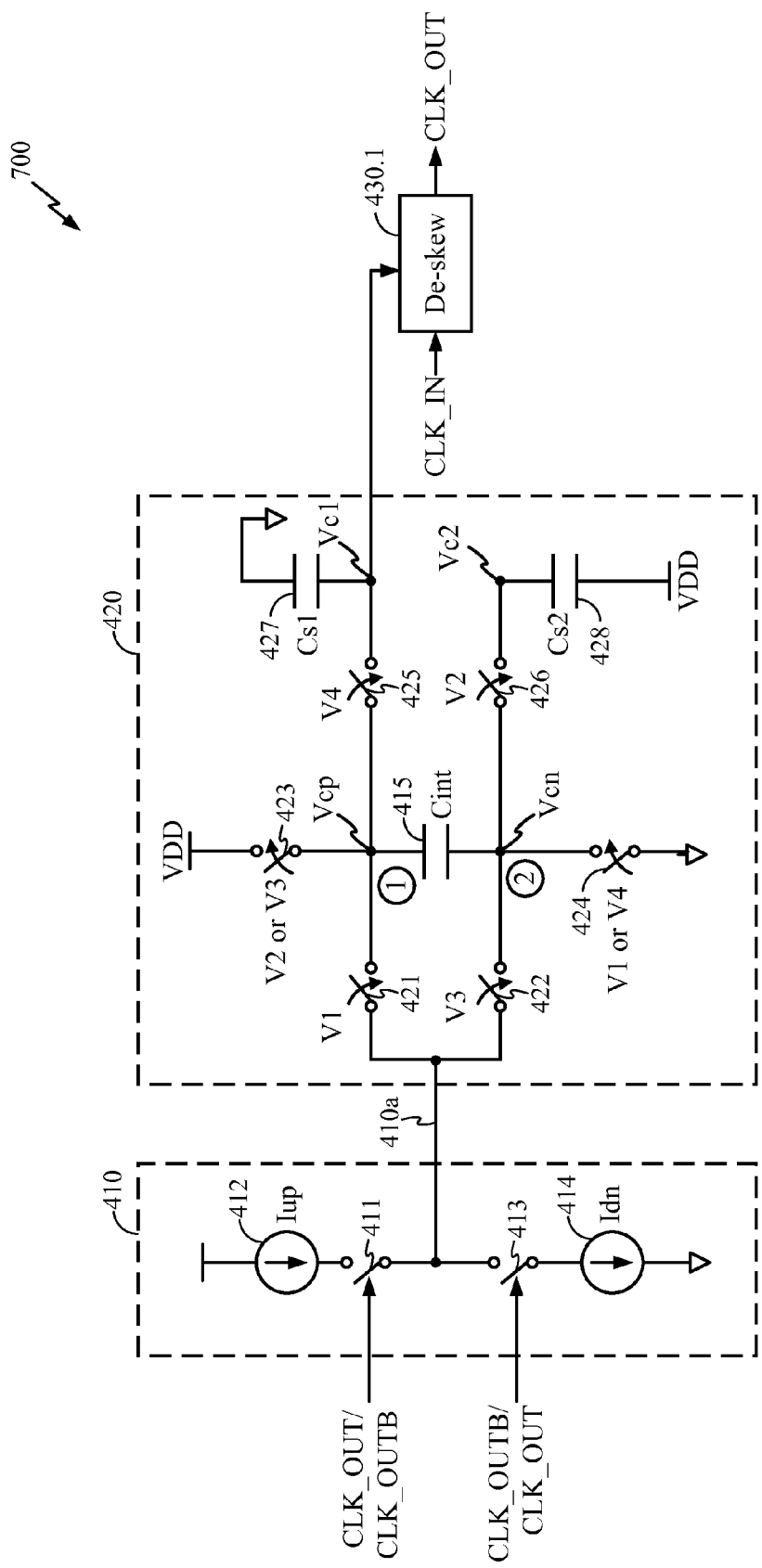
FIG. 7 illustrates an exemplary embodiment of a duty cycle adjustment module that accommodates a single control voltage Vc1 for controlling the de-skew module.

In an exemplary embodiment, either of the control voltages Vc1 or Vc2 may be omitted to drive the de-skew module 430 using a single control voltage. FIG. 7 illustrates an exemplary embodiment of a duty cycle adjustment module 700 that accommodates a single control voltage Vc1 for controlling a de-skew module 430.1. In FIG. 7, the de-skew module 430.1 accepts only one control voltage Vc1 to adjust the duty cycle of CLK_IN to generate CLK_OUT. The operation of the duty cycle adjustment module 700 will be clear to one of ordinary skill in the art in light of the disclosure herein.

Figure 8:
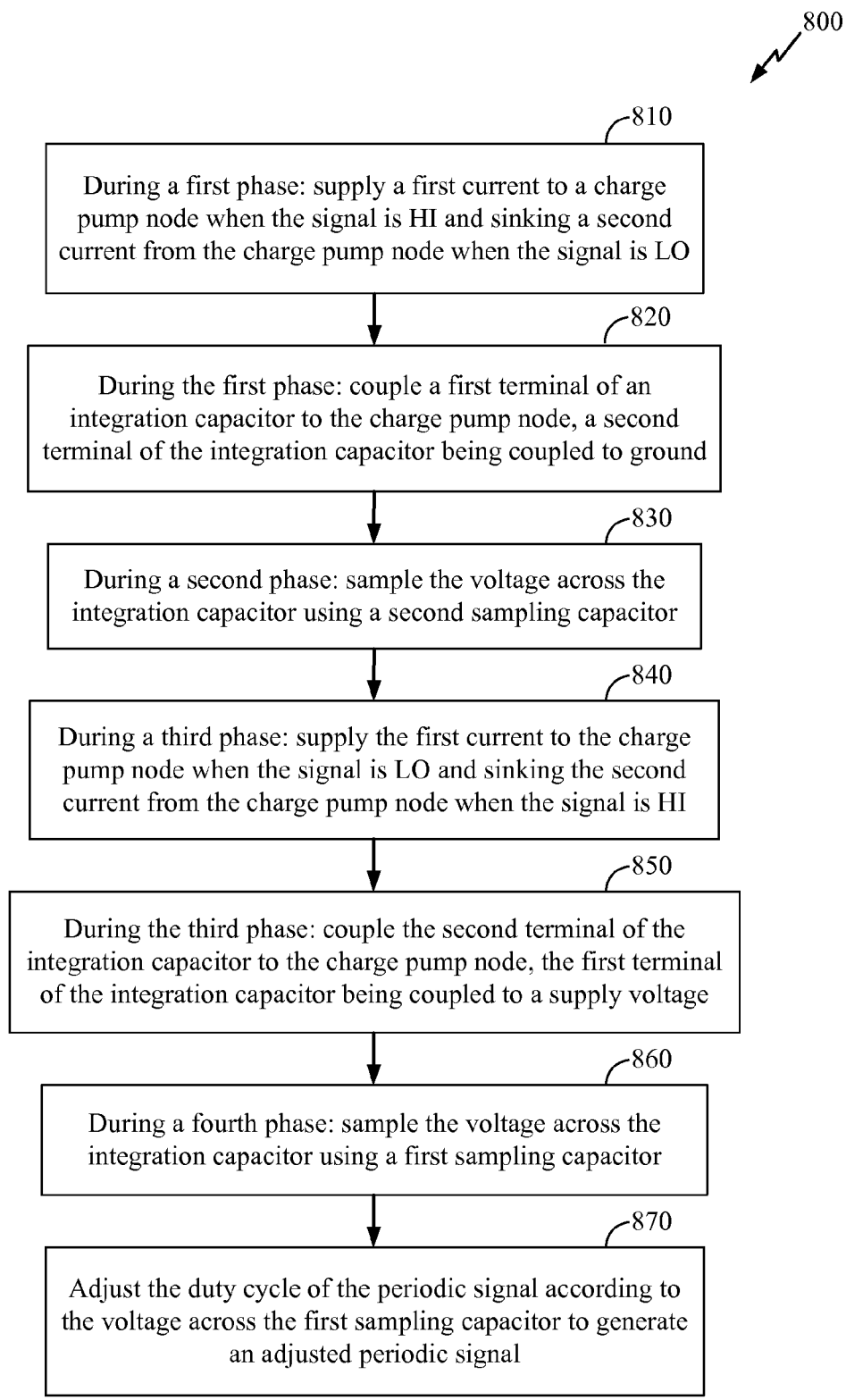
FIG. 8 illustrates an exemplary embodiment of a method according to the present disclosure.

FIG. 8 illustrates an exemplary embodiment of a method 800 according to the present disclosure. Note the method 800 is shown for illustrative purposes only, and is not meant to limit the scope of the present disclosure to any particular method disclosed.

In FIG. 8, at block 810, the method includes, during a first phase: supplying a first current to a charge pump node when the signal is HI and sinking a second current from the charge pump node when the signal is LO.

At block 820, the method includes, during the first phase: coupling a first terminal of an integration capacitor to the charge pump node, a second terminal of the integration capacitor being coupled to ground.

At block 830, the method includes, during a second phase: sampling the voltage across the integration capacitor using a second sampling capacitor.

At block 840, the method includes, during a third phase: supplying the first current to the charge pump node when the signal is LO and sinking the second current from the charge pump node when the signal is HI.

At block 850, the method includes, during the third phase: coupling the second terminal of the integration capacitor to the charge pump node, the first terminal of the integration capacitor being coupled to a supply voltage.

At block 860, the method includes, during a fourth phase: sampling the voltage across the integration capacitor using a first sampling capacitor.

At block 870, the method includes adjusting the duty cycle of the periodic signal according to the voltage across the first sampling capacitor to generate an adjusted periodic signal.

In an alternative exemplary embodiment (not shown), the method may further include adjusting the duty cycle of the periodic signal according to the voltage across the second sampling capacitor to generate the adjusted periodic signal.

Figure 9:
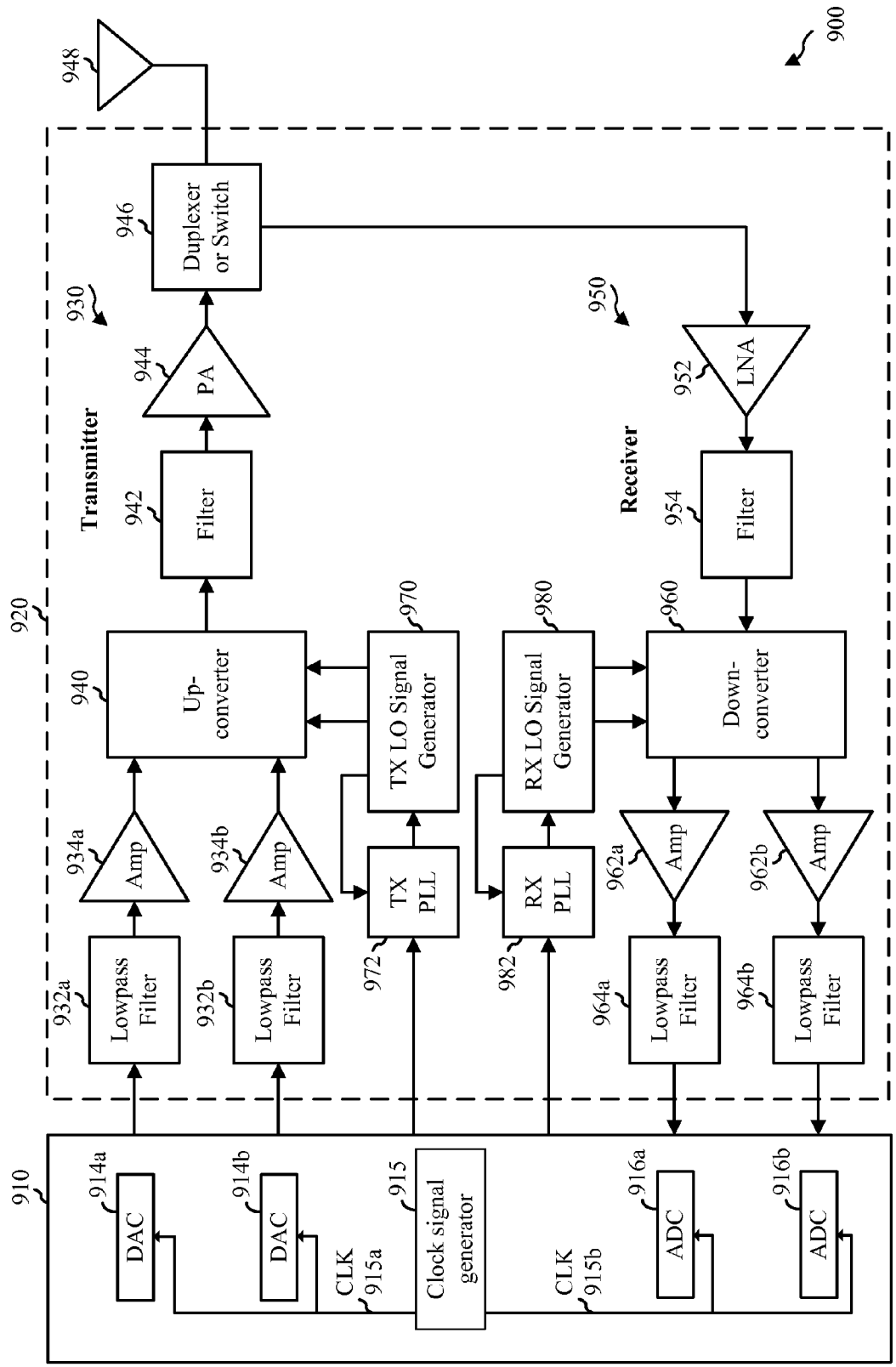
FIG. 9 illustrates a block diagram of a design of a wireless communication device in which the techniques of the present disclosure may be implemented.

FIG. 9 illustrates a block diagram of a design of a wireless communication device 900 in which the techniques of the present disclosure may be implemented. FIG. 9 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 9. Furthermore, other circuit blocks not shown in FIG. 9 may also be used to condition the signals in the transmitter and receiver. Some circuit blocks in FIG. 9 may also be omitted.

In the design shown in FIG. 9, wireless device 900 includes a transceiver 920 and a data processor 910. The data processor 910 may include a memory (not shown) to store data and program codes. Transceiver 920 includes a transmitter 930 and a receiver 950 that support bi-directional communication. In general, wireless device 900 may include any number of transmitters and any number of receivers for any number of communication systems and frequency bands. All or a portion of transceiver 920 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 9, transmitter 930 and receiver 950 are implemented with the direct-conversion architecture.

In the transmit path, data processor 910 processes data to be transmitted and provides I and Q analog output signals to transmitter 930. In the exemplary embodiment shown, the data processor 910 includes digital-to-analog-converters (DAC's) 914a and 914b for converting digital signals generated by the data processor 910 into the I and Q analog output signals. The DAC's 914a and 914b may each be provided with a clock signal 915a generated by a clock signal generator 915. It will be appreciated that the clock signal generator 915 may further include elements such as a PLL 110, clock tree 120, and duty cycle adjustment module 210 (e.g., as shown in FIG. 2) implemented according to the techniques of the present disclosure.

Within transmitter 930, lowpass filters 932a and 932b filter the I and Q analog output signals, respectively, to remove undesired images caused by the prior digital-to-analog conversion. Amplifiers (Amp) 934a and 934b amplify the signals from lowpass filters 932a and 932b, respectively, and provide I and Q baseband signals. An upconverter 940 upconverts the I and Q baseband signals with I and Q transmit (TX) local oscillating (LO) signals from a TX LO signal generator 970 and provides an upconverted signal. A filter 942 filters the upconverted signal to remove undesired images caused by the frequency upconversion as well as noise in a receive frequency band. A power amplifier (PA) 944 amplifies the signal from filter 942 to obtain the desired output power level and provides a transmit RF signal. The transmit RF signal is routed through a duplexer or switch 946 and transmitted via an antenna 948.

In the receive path, antenna 948 receives signals transmitted by base stations and provides a received RF signal, which is routed through duplexer or switch 946 and provided to a low noise amplifier (LNA) 952. The received RF signal is amplified by LNA 952 and filtered by a filter 954 to obtain a desirable RF input signal. A downconverter 960 downconverts the RF input signal with I and Q receive (RX) LO signals from an RX LO signal generator 980 and provides I and Q baseband signals. The I and Q baseband signals are amplified by amplifiers 962a and 962b and further filtered by lowpass filters 964a and 964b to obtain I and Q analog input signals, which are provided to data processor 910. In the exemplary embodiment shown, the data processor 910 includes analog-to-digital-converters (ADC's) 916a and 916b for converting the analog input signals into digital signals to be further processed by the data processor 910. The ADC's 916a and 916b may each be provided with a clock signal 915b generated by the clock signal generator 915.

In an exemplary embodiment, the clock signal generator 915 may utilize the techniques disclosed herein for generating signals with predetermined frequency and/or duty cycle. For example, the clock signal generator 915 may adjust a CLK_OUT signal to have a predetermined duty cycle using the techniques disclosed herein. Such exemplary embodiments are contemplated to be within the scope of the present disclosure.

TX LO signal generator 970 generates the I and Q TX LO signals used for frequency upconversion. RX LO signal generator 980 generates the I and Q RX LO signals used for frequency downconversion. Each LO signal is a periodic signal with a particular fundamental frequency. A PLL 972 receives timing information from data processor 910 and generates a control signal used to adjust the frequency and/or phase of the TX LO signals from LO signal generator 970. Similarly, a PLL 982 receives timing information from data processor 910 and generates a control signal used to adjust the frequency and/or phase of the RX LO signals from LO signal generator 980.

Figure 10:
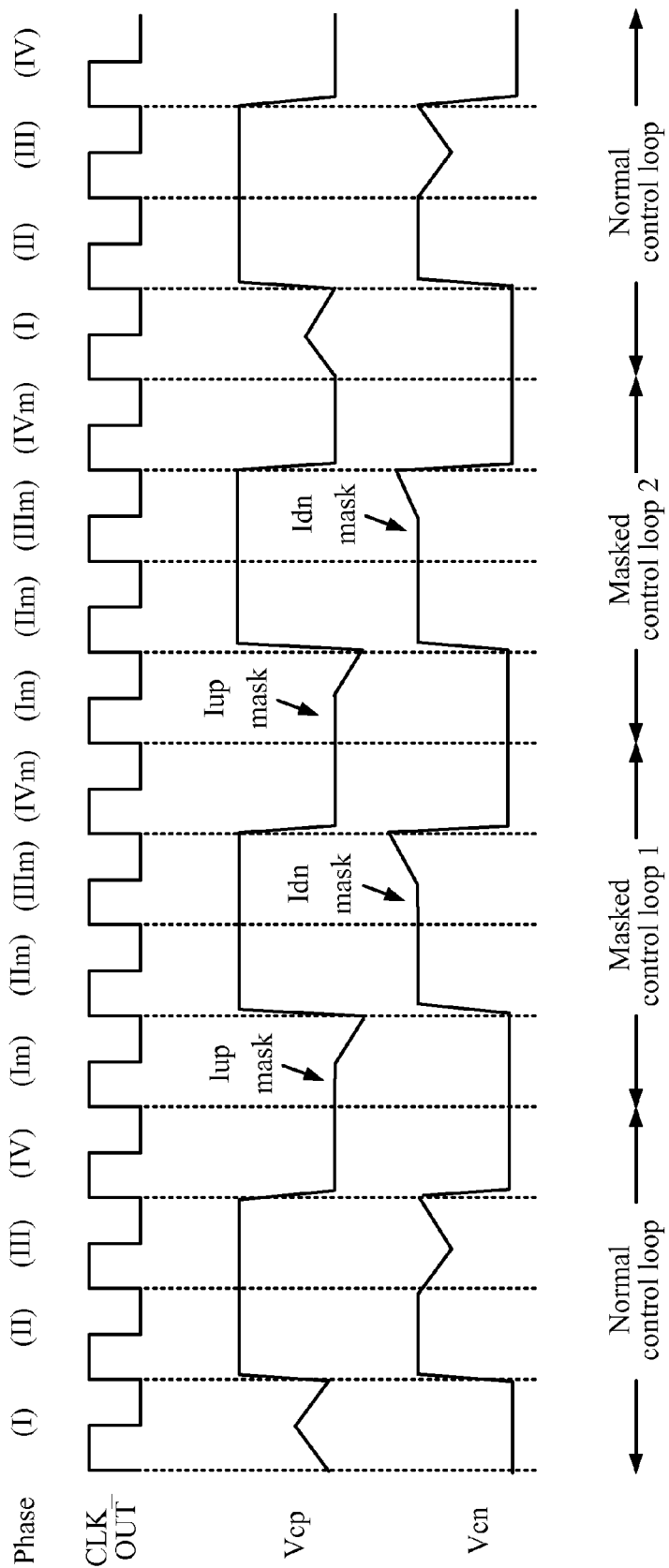
FIG. 10 illustrates an exemplary embodiment of operation of the duty cycle adjustment module to generate signals having duty cycle other than 50%.

FIG. 10 illustrates an exemplary embodiment of operation of the duty cycle adjustment module 400 to generate signals having duty cycle other than 50%.

In FIG. 10, a series of control loops are shown, wherein each phase of each control loop has a duration of one cycle of CLK_OUT. In particular, during each of two normal control loops, phases I, II, III, and IV occur in succession, as earlier described herein. Also shown in FIG. 10 are two masked control loops 1 and 2. During each masked control loop, phases Im, IIm, IIIm, and IVm occur in succession, as further described hereinbelow.

During a first phase (Im) of each masked control loop, the charge pump operation is "masked," or suspended, when CLK_OUT is HI. The voltage Vcp is seen to remain correspondingly constant when CLK_OUT is HI, as indicated by the "Iup mask" arrows in FIG. 10.

Furthermore, during a third phase (IIIm) of each masked control loop, the charge pump operation is masked when CLK_OUT is HI. The voltage Vcp is seen to remain constant when CLK_OUT is HI, as indicated by the "Idn mask" arrows in FIG. 10.

Operation during the second and fourth phases of each masked control loop proceeds as according to the second and fourth phases of a normal control loop.

From the above description, the net charge injected into the first and second terminals of Cint during a single masked control loop (including the first and third phases of a masked control loop) may be expressed as follows:

$$dQ1m=-Idn*tLO; \text{ and} \quad \text{(Eq. 6a)}$$

$$dQ2m=Iup*tLO; \quad \text{(Eq. 6b)}$$

wherein dQ1m and dQ2m represent the charges injected during a masked control loop into the first and second terminals, respectively, of the integration capacitor Cint 415.

In an exemplary embodiment, a series of composite control loops may be provided, wherein each composite control loop includes b masked control loops and a normal control loops. The total charge injected into Cint over each composite control loop may then be expressed as follows:

$$\text{Total Charge} = (dQ1-dQ2)*a + (dQ1m-dQ2m)*b; \quad \text{(Eq. 7a)}$$

$$= a*(tHI-tLO)*(Iup+Idn) - b*tLO*(Iup+Idn); \quad \text{(Eq. 7b)}$$

$$= (Iup+Idn)+[tHI*a-tLO*(a+b)]. \quad \text{(Eq. 7c)}$$

Setting the total charge equal to zero in steady state, the duty cycle of the resulting signal may be computed as follows:

$$(Iup+Idn)*[tHI*a-tLO*(a+b)]=0; \quad \text{(Eq. 8a)}$$

$$tHI*a=tLO*(a+b); \quad \text{(Eq. 8b)}$$

$$tHI/tLO=(a+b)/a; \text{ and} \quad \text{(Eq. 8c)}$$

$$tHI/(tHI+tLO)=(a+b)/(2a+b). \quad \text{(Eq. 8d)}$$

For example, setting a=2 and b=2, a signal with duty cycle of 66.7% may be generated according to the principles described herein. Note that while b=2 masked control loops are explicitly shown in FIG. 10, it will be appreciated that both a and b may generally have any arbitrary value according to the present disclosure.

One of ordinary skill in the art will appreciate in light of the preceding disclosure that the duration of each phase in the masked control loop or normal control loop may alternatively be made greater than the one cycle of CLK_OUT shown in FIG. 10. Furthermore, different schemes for masking the charge pump operation will be clear in light of the present disclosure. For example, in an exemplary embodiment, the charge pump operation may alternatively be masked when CLK_OUT is LO during the first (Im) and third (IIIm) phases of a masked control loop. Such alternative exemplary embodiments are contemplated to be within the scope of the present disclosure.

It will be appreciated that in an exemplary embodiment, during a masked control loop, only the operation of the dual-phase charge pump 410 need be modified compared to a normal control loop, while the charge and sample module 420 may be operated identically as in a normal control loop.

In an exemplary embodiment, a and b may be directly specified to the duty cycle adjustment module 400, and a corresponding charge pump masking block (not shown) may be provided, to achieve a non-50% duty cycle according to the principles described above.

In an alternative exemplary embodiment, the parameters a and b described hereinabove may alternatively be specified using parameters M and N defined as follows:

$$N=(2a+b)/2; \text{ and} \quad \text{Eq. (9a)}$$

$$M=b/2. \quad \text{Eq. (9b)}$$

Substituting Eqs. (9a) and (9b) into Eq. (8d) above, the duty cycle may be expressed as follows:

$$tHI/(tHI+tLO)=(N+M)/2N. \quad \text{(Eq. 9c)}$$

It will be appreciated that specifying parameters M and N, rather than a and b, to the duty cycle adjustment module advantageously allows the duty cycle to be specified using M over a range from 50% (i.e., M=0) to 100% (i.e., M=N) with a uniform step size of ½N.

Figure 11:
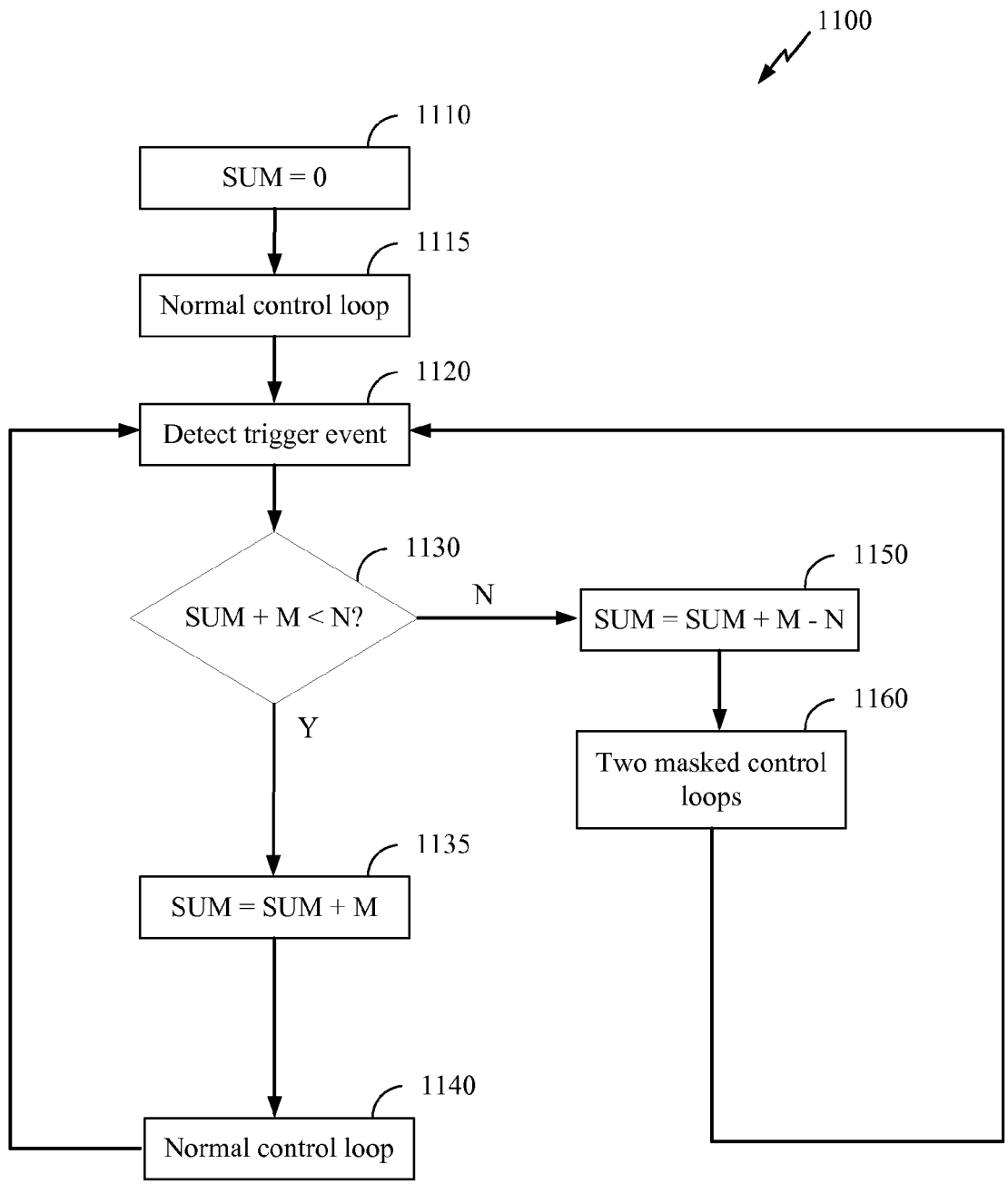
FIG. 11 illustrates an exemplary embodiment of the operation of an M–N accumulator according to the present disclosure.

In an exemplary embodiment, a programmable M–N accumulator may further be provided to control the ratio of M to N to program the duty cycle. FIG. 11 illustrates an exemplary embodiment of the operation of an M–N accumulator according to the present disclosure. In FIG. 11, M and N denote integer values that may be programmed to select a desired duty cycle, with N larger than M.

In FIG. 11, at block 1110, a variable SUM is initialized to zero.

At block 1115, a normal control loop is introduced.

At block 1120, a trigger event is detected. In an exemplary embodiment, the trigger event may be a rising edge of CLK_OUT associated with the fourth phase of a normal or masked control loop. It will be appreciated that in alternative exemplary embodiments, the trigger event may be associated with any other phase of a control loop, or any other periodic event.

At block 1130, it is determined whether SUM+M is less than N. If yes, operation proceeds to block 1135. If no, operation proceeds to block 1150.

At block 1135, SUM is incremented by M.

At block 1140, a normal control loop is introduced.

At block 1150, SUM is incremented by M−N (which results in a net decrease in the value of SUM).

At block 1160, two masked control loops are introduced. Operation returns to block 1120.

Figure 12:
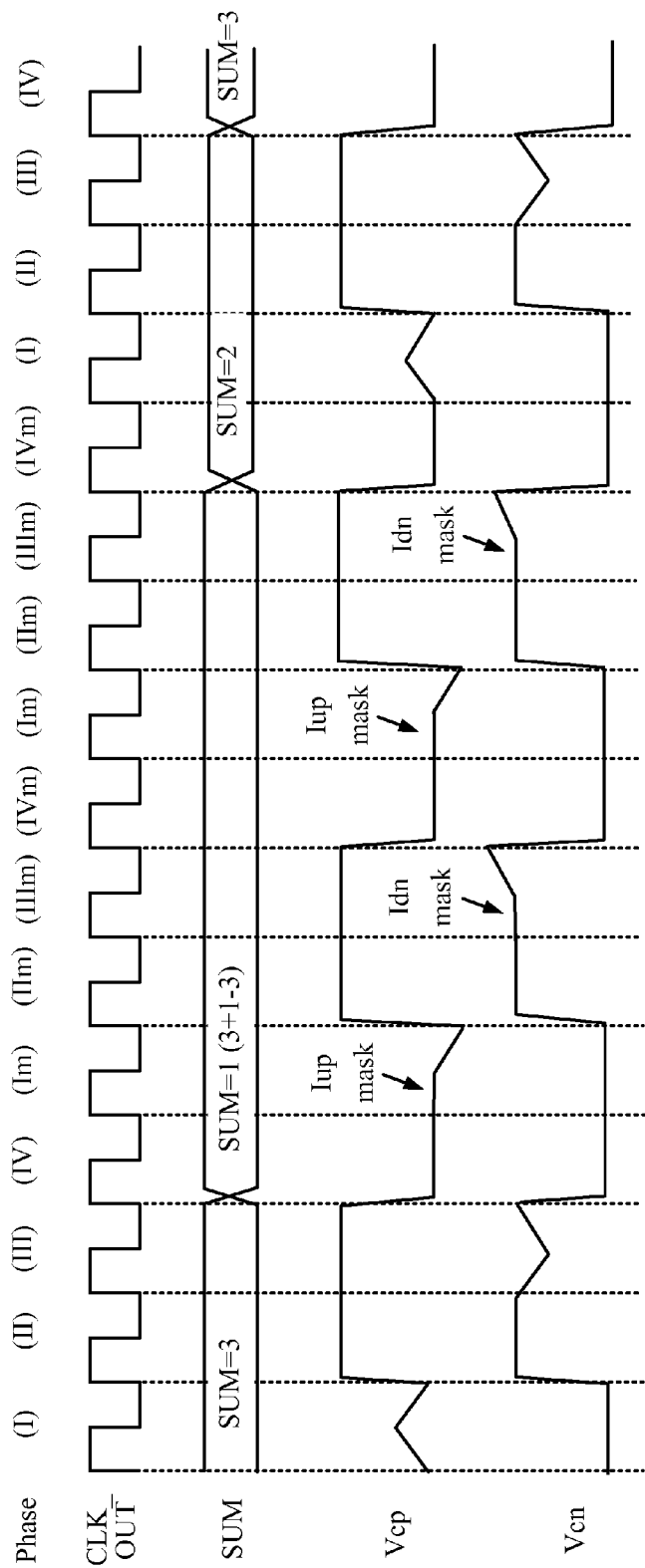
FIG. 12 illustrates a timing diagram of the exemplary embodiment of operation with the M–N accumulator described in FIG. 11, with M=1 and N=3.

FIG. 12 illustrates a timing diagram of the exemplary embodiment 1100 of operation with the M–N accumulator described in FIG. 11, with M=1 and N=3.

In FIG. 12, the status of the variable SUM is seen to be equal to 3 at the beginning of the timing diagram. Upon detecting a trigger event, which is set to the beginning of a fourth phase (IV or IVm) in this exemplary embodiment, SUM is incremented by a value (1−3) to equal 1.

While SUM is equal to 1, two masked control loops are introduced. Following the two masked control loops, SUM+M, or 1+1=2, is compared to N=3, whereupon SUM increments by M to equal 2, and a normal control loop is introduced. Operation continues as previously described with reference to FIG. 11.

One of ordinary skill in the art will appreciate from the preceding description that by programming M and N, the ratio of masked control loops to normal control loops may be conveniently adjusted as desired to change the duty cycle of a generated signal.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. An apparatus for adjusting a duty cycle of a periodic signal to generate an adjusted signal, the adjusted signal being alternately high (HI) and low (LO) over each cycle, the apparatus comprising:
  a dual-phase charge pump configured to, during a first phase, supply current to a charge pump node when the adjusted signal is HI and to sink current from the charge pump node when the adjusted signal is LO, the dual-phase charge pump further configured to, during a third phase, supply current to the charge pump node when the adjusted signal is LO and to sink current from the charge pump node when the adjusted signal is HI;
  a charge and sample module comprising an integration capacitor having first and second terminals, the charge and sample module configured to:
    during the first phase, couple the first terminal of the integration capacitor to the charge pump node, the second terminal of the integration capacitor being coupled to ground;
    during a second phase, sample a voltage across the integration capacitor using a second sampling capacitor;
    during the third phase, couple the second terminal of the integration capacitor to the charge pump node, the first terminal of the integration capacitor being coupled to a supply voltage;
    during a fourth phase, sample the voltage across the integration capacitor using a first sampling capacitor; and
  a de-skew module for adjusting the duty cycle of the periodic signal to generate an adjusted periodic signal, the duty cycle of the periodic signal adjusted according to a voltage across the first sampling capacitor.

2. The apparatus of claim 1, wherein the second phase immediately follows the first phase, the third phase immediately follows the second phase, the fourth phase immediately follows the third phase, and the first phase immediately follows the fourth phase.

3. The apparatus of claim 1, wherein each of the phases has a duration of one cycle of the adjusted signal.

4. The apparatus of claim 1, wherein each of the phases has a duration of more than one cycle of the adjusted signal.

5. The apparatus of claim 1, wherein each of the phases has a programmable duration of one or more cycles of the adjusted signal.

6. The apparatus of claim 1, wherein the duty cycle of the periodic signal is further adjusted according to a voltage across the second sampling capacitor.

7. The apparatus of claim 1, wherein the first sampling capacitor and the integration capacitor are coupled to ground during the second phase.

8. The apparatus of claim 7, wherein the second sampling capacitor and the integration capacitor are coupled to the supply voltage during the fourth phase.

9. The apparatus of claim 1, wherein the charge and sample module further comprises:
  a switch for coupling the first terminal of the integration capacitor to the charge pump node during the first phase;
  a switch for coupling the second terminal of the integration capacitor to the charge pump node during the third phase;
  a switch for coupling the first terminal of the integration capacitor to the supply voltage during the second and third phases; and
  a switch for coupling the second terminal of the integration capacitor to ground during the first and fourth phases.

10. The apparatus of claim 9, wherein the charge and sample module further comprises:
  a switch for coupling the first terminal of the integration capacitor to the first sampling capacitor during the fourth phase; and
  a switch for coupling the second terminal of the integration capacitor to the second sampling capacitor during the second phase.

11. The apparatus of claim 1, wherein the dual-phase charge pump is further configured to, during a first masked phase, not supply current to the charge pump node when the adjusted signal is HI and to sink current from the charge pump node when the adjusted signal is LO, and the dual-phase charge pump is further configured to, during a third masked phase, supply current to the charge pump node when the adjusted signal is LO and to not sink current from the charge pump node when the adjusted signal is HI, the first and third masked phases being alternated with the first and third phases.

12. The apparatus of claim 11, wherein the dual-phase charge pump further is configured with a number of masked control loops comprising first and third masked phases, and a number of normal control loops comprising first and third phases.

13. The apparatus of claim 12, wherein variables M and N are calculated using the number of masked control loops and the number of normal control loops, wherein M is equal to the number of masked control loops divided by two, and N is equal to ((the number of normal control loops multiplied by two) plus the number of masked control loops) divided by two.

14. The apparatus of claim 11, further comprising an M–N accumulator storing variables M, N, and SUM, the M–N accumulator configured to, upon detecting a trigger event:
  if SUM plus M is less than N, accumulate M to SUM and introduce a normal control loop comprising first and third phases, else accumulate (M minus N) to SUM and configure the charge pump to operate using two masked control loops comprising first and third masked phases.

15. The apparatus of claim 14, wherein the trigger event comprises a start of the fourth phase.

16. A method for adjusting a duty cycle of a periodic signal to generate an adjusted signal, the adjusted signal being alternately high (HI) and low (LO) over each cycle, the method comprising:
  during a first phase: supplying a first current to a charge pump node when the adjusted signal is HI and sinking a second current from the charge pump node when the adjusted signal is LO; and coupling a first terminal of an integration capacitor to the charge pump node, a second terminal of the integration capacitor being coupled to ground;

during a second phase: sampling a voltage across the integration capacitor using a second sampling capacitor;

during a third phase: supplying the first current to the charge pump node when the adjusted signal is LO and sinking the second current from the charge pump node when the adjusted signal is HI; and coupling the second terminal of the integration capacitor to the charge pump node, the first terminal of the integration capacitor being coupled to a supply voltage;

during a fourth phase: sampling the voltage across the integration capacitor using a first sampling capacitor; and adjusting the duty cycle of a periodic signal according to the voltage across the first sampling capacitor to generate an adjusted periodic signal.

17. The method of claim 16, further comprising programming durations of the phases to be one or more cycles of the adjusted signal.

18. The method of claim 16, further comprising adjusting the duty cycle of the periodic signal according to a voltage across the second sampling capacitor to generate the adjusted periodic signal.

19. The method of claim 16, further comprising coupling the first sampling capacitor and the integration capacitor to ground during the second phase.

20. The method of claim 19, further comprising coupling the second sampling capacitor and the integration capacitor to the supply voltage during the fourth phase.

21. The method of claim 16, further comprising:
using a switch to couple the first terminal of the integration capacitor to the charge pump node during the first phase;
using a switch to couple the second terminal of the integration capacitor to the charge pump node during the third phase;
using a switch to couple the first terminal of the integration capacitor to the supply voltage during the second and third phases; and
using a switch to couple the second terminal of the integration capacitor to ground during the first and fourth phases.

22. The method of claim 21, further comprising:
using a switch to couple the first terminal of the integration capacitor to the first sampling capacitor during the fourth phase; and
using a switch to couple the second terminal of the integration capacitor to the second sampling capacitor during the second phase.

23. The method of claim 16, further comprising:
during a first masked phase: not supplying a first current to a charge pump node when the adjusted signal is HI and sinking a second current from the charge pump node when the adjusted signal is LO; and coupling the first terminal of the integration capacitor to the charge pump node, the second terminal of the integration capacitor being coupled to ground;
during a third masked phase: supplying the first current to the charge pump node when the adjusted signal is LO and not sinking the second current from the charge pump node when the adjusted signal is HI; and coupling the second terminal of the integration capacitor to the charge pump node, the first terminal of the integration capacitor being coupled to the supply voltage; and
alternating between a number of masked control loops comprising first and third masked phases and a number of normal control loops comprising first and third phases.

24. The method of claim 23, wherein variables M and N are calculated using the number of masked control loops and the number of normal control loops, wherein M is equal to the number of masked control loops divided by two, and N is equal to ((the number of normal control loops multiplied by two) plus the number of masked control loops) divided by two.

25. The method of claim 23, further comprising storing variables M, N, and SUM, wherein alternating between the number of masked control loops comprising first and third masked phases and the number of normal control loops comprising first and third phases comprises:
upon detecting a trigger event: if SUM plus M is less than N, accumulating M to SUM and initiating a normal control loop, else:
accumulating (M minus N) to SUM; and
initiating two masked control loops.

26. The method of claim 17, further comprising:
during a first masked phase: supplying the first current to the charge pump node when the adjusted signal is HI and not sinking the second current from the charge pump node when the adjusted signal is LO; and coupling the first terminal of an integration capacitor to the charge pump node, the second terminal of the integration capacitor being coupled to ground;
during a third masked phase: not supplying the first current to the charge pump node when the adjusted signal is LO and sinking the second current from the charge pump node when the adjusted signal is HI; and coupling the second terminal of the integration capacitor to the charge pump node, the first terminal of the integration capacitor being coupled to the supply voltage; the method further comprising alternating between first and third masked phases and first and third phases.

27. An apparatus for adjusting a duty cycle of a periodic signal to generate an adjusted signal, the apparatus comprising:
dual-phase means for supplying current to and sinking current from a charge pump node;
means for charging and sampling an integration capacitor having first and second terminals, the means configured to:
during a first phase, couple the first terminal of the integration capacitor to the charge pump node, the second terminal of the integration capacitor being coupled to ground;
during a second phase, sample a voltage across the integration capacitor using a second sampling capacitor;
during a third phase, couple the second terminal of the integration capacitor to the charge pump node, the first terminal of the integration capacitor being coupled to a supply voltage; and
during a fourth phase, sample the voltage across the integration capacitor using a first sampling capacitor; and
means for adjusting the duty cycle of the periodic signal to generate the adjusted signal in response to at least one voltage of the first sampling capacitor or the second sampling capacitor.

28. The apparatus of claim 27, further comprising means for preventing the dual-phase means from supplying current to or sinking current from the charge pump node over a portion of a phase to generate the adjusted signal having a programmable duty cycle.

29. A non-transitory computer readable storage medium storing code for causing a computer to adjust a duty cycle of a periodic signal to generate an adjusted signal, the code comprising:
 code for causing the computer to, during a first phase: supply a first current to a charge pump node when the adjusted signal is high (HI) and sink a second current from the charge pump node when the adjusted signal is low (LO); and couple a first terminal of an integration capacitor to the charge pump node, a second terminal of the integration capacitor being coupled to ground;
 code for causing the computer to, during a second phase: sample a voltage across the integration capacitor using a second sampling capacitor;
 code for causing the computer to, during a third phase: supply the first current to the charge pump node when the adjusted signal is LO and sink the second current from the charge pump node when the adjusted signal is HI; and couple the second terminal of the integration capacitor to the charge pump node, the first terminal of the integration capacitor being coupled to a supply voltage;
 code for causing the computer to, during a fourth phase: sample the voltage across the integration capacitor using a first sampling capacitor; and
 code for causing the computer to, adjust the duty cycle of the periodic signal according to a voltage across the first sampling capacitor to generate an adjusted periodic signal.

30. A device for wireless communications, the device comprising at least one digital-to-analog converter (DAC) for converting a digital TX signal to an analog TX signal, at least one baseband TX amplifier for amplifying the analog TX signal, a TX LO signal generator, an upconverter coupled to the TX LO signal generator and the at least one baseband TX amplifier, a TX filter coupled to an output of the upconverter, a power amplifier (PA) coupled to the TX filter, an RX filter, a low-noise amplifier (LNA) coupled to the RX filter, an RX LO signal generator, a downconverter coupled to the RX LO signal generator and the RX filter, at least one low-pass filter coupled to an output of the downconverter, at least one analog-to-digital converter (ADC) for converting an output of the low-pass filter into a digital signal, a clock signal generator to adjust a duty cycle of a periodic signal to generate an adjusted signal, the adjusted signal being alternately high (HI) and low (LO) over each cycle, at least one of the DAC and the ADC being driven by the adjusted signal generated by the clock signal generator, the clock signal generator comprising:
 a dual-phase charge pump configured to, during a first phase, supply current to a charge pump node when the adjusted signal is HI and to sink current from the charge pump node when the adjusted signal is LO, the dual-phase charge pump further configured to, during a third phase, supply current to the charge pump node when the adjusted signal is LO and to sink current from the charge pump node when the adjusted signal is HI;
 a charge and sample module comprising an integration capacitor having first and second terminals, the charge and sample module configured to:
  during a first phase, couple the first terminal of the integration capacitor to the charge pump node, the second terminal of the integration capacitor being coupled to ground;
  during a second phase, sample the voltage across the integration capacitor using a second sampling capacitor;
  during a third phase, couple the second terminal of the integration capacitor to the charge pump node, the first terminal of the integration capacitor being coupled to a supply voltage; and
  during a fourth phase, sample the voltage across the integration capacitor using a first sampling capacitor; and
 a de-skew module for adjusting the duty cycle of the periodic signal to generate an adjusted periodic signal, the duty cycle of the periodic signal adjusted according to a voltage across the first sampling capacitor.

31. An apparatus comprising:
 a dual-phase charge pump comprising a first current source and a second current source, the first and second current source coupled to a charge pump node by first and second charge pump switches, respectively;
 a charge and sample module comprising: an integration capacitor having first and second terminals; first and second charge switches coupling the first and second terminals, respectively, of the integration capacitor to the charge pump node; third and fourth charge switches coupling the first and second terminals, respectively, of the integration capacitor to reference voltages; and first and second sample switches coupling the first and second terminals, respectively, of the integration capacitor to first and second sampling capacitors, respectively; and
 a de-skew module for adjusting a duty cycle of a periodic signal to generate an adjusted periodic signal, the duty cycle of the periodic signal adjusted according to a voltage across the first sampling capacitor.

* * * * *